United States Patent
Ninan et al.

(10) Patent No.: US 11,454,847 B2
(45) Date of Patent: Sep. 27, 2022

(54) QUANTUM DOT/REMOTE PHOSPHOR DISPLAY SYSTEM IMPROVEMENTS

(71) Applicant: Dolby Laboratories Licensing Corporation, San Francisco, CA (US)

(72) Inventors: Ajit Ninan, San Jose, CA (US); Chun Chi Wan, Campbell, CA (US); Timo Kunkel, Kensington, CA (US); Michael Eugene Miller, Xenia, OH (US)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 181 days.

(21) Appl. No.: 16/568,201

(22) Filed: Sep. 11, 2019

(65) Prior Publication Data

US 2020/0003394 A1    Jan. 2, 2020

Related U.S. Application Data

(63) Continuation of application No. 15/596,564, filed on May 16, 2017, now Pat. No. 10,443,818, which is a
(Continued)

(51) Int. Cl.
*G02F 1/13357*    (2006.01)
*F21V 9/08*        (2018.01)
(Continued)

(52) U.S. Cl.
CPC .......... *G02F 1/133617* (2013.01); *F21V 9/08* (2013.01); *G02B 5/201* (2013.01);
(Continued)

(58) Field of Classification Search
CPC ..... G02F 1/133617; G02B 5/22; G02B 5/201; F21V 9/08; B82Y 20/00
See application file for complete search history.

(56) References Cited

U.S. PATENT DOCUMENTS

| 5,138,441 A | 8/1992 | Tanaka |
| 5,737,045 A | 4/1998 | Abileah |

(Continued)

FOREIGN PATENT DOCUMENTS

| CN | 1605041 | 4/2005 |
| CN | 1682270 A | 10/2005 |

(Continued)

OTHER PUBLICATIONS

Green, Kate, "How Quantum Dots Will Make LCDs Better", Dec. 9, 2009, QD Vision.
(Continued)

*Primary Examiner* — Alexander G Ghyka

(57) ABSTRACT

A display system comprises light sources configured to emit first light with a first spectral power distribution; light regeneration layers configured to be stimulated by the first light and to convert at least a portion of the first light and recycled light into second light, the second light comprising (a) primary spectral components that correspond to primary colors and (b) secondary spectral components that do not correspond to the primary colors; and notch filter layers configured to receive a portion of the second light and to filter out the secondary spectral components from the portion of the second light. The portion of the second light can be directed to a viewer of the display system and configured to render images viewable to the viewer.

9 Claims, 21 Drawing Sheets

Related U.S. Application Data continuation of application No. 14/030,896, filed on Sep. 18, 2013, now Pat. No. 9,746,157.

(60) Provisional application No. 61/703,020, filed on Sep. 19, 2012.

(51) Int. Cl.

| | | |
|---|---|---|
| *G02B 5/20* | (2006.01) | |
| *G02B 5/22* | (2006.01) | |
| *H01L 27/32* | (2006.01) | |
| *H01L 51/56* | (2006.01) | |
| *B82Y 20/00* | (2011.01) | |
| *H04N 13/334* | (2018.01) | |
| *G02F 1/1335* | (2006.01) | |

(52) U.S. Cl.
CPC ............. *G02B 5/22* (2013.01); *H01L 27/322* (2013.01); *H01L 51/56* (2013.01); *B82Y 20/00* (2013.01); *G02F 1/133514* (2013.01); *G02F 1/133516* (2013.01); *G02F 1/133614* (2021.01); *G02F 2202/046* (2013.01); *H01L 2251/5369* (2013.01); *H04N 13/334* (2018.05); *Y10S 977/774* (2013.01)

(56) References Cited

U.S. PATENT DOCUMENTS

| | | |
|---|---|---|
| 5,754,159 A | 5/1998 | Wood |
| 5,774,257 A | 6/1998 | Shibata |
| 5,920,361 A | 7/1999 | Gibeau |
| 6,031,328 A | 2/2000 | Nakamoto |
| 6,470,115 B1 | 10/2002 | Yonekubo |
| 6,608,439 B1 | 8/2003 | Sokolik |
| 6,864,626 B1 | 3/2005 | Weiss |
| 7,048,427 B2 | 5/2006 | Fujino |
| 7,126,254 B2 | 10/2006 | Nanataki |
| 7,230,603 B2 | 6/2007 | Yamamoto |
| 7,420,323 B2 | 9/2008 | Krummacher |
| 7,430,022 B2 | 9/2008 | Hekstra |
| 7,465,104 B2 | 12/2008 | Tokui |
| 7,481,562 B2 | 1/2009 | Chua |
| 7,486,854 B2 | 2/2009 | Van Ostrand |
| 7,537,947 B2 | 5/2009 | Smith |
| 7,649,594 B2 | 1/2010 | Kim |
| 7,686,493 B2 | 3/2010 | Roshan |
| 7,696,684 B2 | 4/2010 | Weiss |
| 7,733,017 B2 | 6/2010 | Shapiro |
| 7,746,423 B2 | 6/2010 | Im |
| 7,751,663 B2 | 7/2010 | Van Ostrand |
| 7,768,023 B2 | 8/2010 | Diana |
| 7,845,822 B2 | 12/2010 | Bierhuizen |
| 7,858,409 B2 | 12/2010 | Kessels |
| 7,982,812 B2 | 7/2011 | Rho |
| 7,988,311 B2 | 8/2011 | Helbing |
| 8,026,661 B2 | 9/2011 | Weiss |
| 8,035,772 B2 | 10/2011 | Kim |
| 8,075,148 B2 | 12/2011 | Nada |
| 8,164,820 B2 | 4/2012 | Cho |
| 8,203,785 B2 | 6/2012 | Kindler |
| 8,210,701 B2 | 7/2012 | Igarashi |
| 8,215,815 B2 | 7/2012 | Meir |
| 8,242,679 B2 | 8/2012 | Noh |
| 8,294,168 B2 | 10/2012 | Park |
| 8,684,546 B2 | 4/2014 | Ninan |
| 8,773,453 B2 | 7/2014 | Ninan |
| 9,746,157 B2 | 8/2017 | Ninan |
| 2001/0008395 A1 | 7/2001 | Yamamoto |
| 2003/0117546 A1 | 6/2003 | Conner |
| 2004/0061708 A1 | 4/2004 | Oh |
| 2005/0269950 A1 | 12/2005 | Giraldo |
| 2006/0056197 A1 | 3/2006 | Robinson |
| 2006/0103589 A1 | 5/2006 | Chua |
| 2006/0104058 A1 | 5/2006 | Chemel |
| 2006/0109682 A1 | 5/2006 | Ko |
| 2006/0121371 A1 | 6/2006 | Wu |
| 2006/0221012 A1 | 10/2006 | Ikeda |
| 2006/0221021 A1 | 10/2006 | Hajjar |
| 2006/0221022 A1 | 10/2006 | Hajjar |
| 2006/0238103 A1 | 10/2006 | Choi |
| 2006/0244367 A1 | 11/2006 | Im |
| 2007/0029560 A1 | 2/2007 | Su |
| 2007/0096141 A1 | 5/2007 | Chen |
| 2007/0139449 A1 | 6/2007 | Bergquist |
| 2007/0171186 A1 | 7/2007 | Chang et al. |
| 2007/0246734 A1 | 10/2007 | Lee |
| 2007/0247573 A1 | 10/2007 | Ouderkirk |
| 2007/0268240 A1 | 11/2007 | Lee |
| 2007/0279369 A1 | 12/2007 | Yao |
| 2008/0007172 A1 | 1/2008 | Tan |
| 2008/0074583 A1* | 3/2008 | Li ............ G02F 1/133617 349/71 |
| 2008/0136758 A1 | 6/2008 | Ohta |
| 2008/0172197 A1 | 7/2008 | Skipor |
| 2008/0215279 A1 | 9/2008 | Salsbury |
| 2008/0225520 A1 | 9/2008 | Garbus |
| 2008/0230795 A1 | 9/2008 | Dias |
| 2009/0034292 A1 | 2/2009 | Pokrovskiy |
| 2009/0039448 A1 | 2/2009 | Chuang |
| 2009/0059554 A1 | 3/2009 | Skipor |
| 2009/0091689 A1 | 4/2009 | Rho |
| 2009/0109517 A1 | 4/2009 | Cho |
| 2009/0116232 A1 | 5/2009 | Chang |
| 2009/0162011 A1 | 6/2009 | Coe-Sullivan |
| 2009/0180055 A1 | 7/2009 | Kim |
| 2009/0190095 A1 | 7/2009 | Ellinger |
| 2009/0194774 A1 | 8/2009 | Huang |
| 2009/0196014 A1 | 8/2009 | Hsiao |
| 2009/0231831 A1 | 9/2009 | Hsiao |
| 2009/0285478 A1 | 11/2009 | Thiebaud |
| 2009/0311939 A1 | 12/2009 | Elliott |
| 2009/0322800 A1 | 12/2009 | Atkins |
| 2010/0020242 A1 | 1/2010 | Lammers |
| 2010/0079704 A1 | 4/2010 | Cho |
| 2010/0084674 A1 | 4/2010 | Paetzold |
| 2010/0102251 A1 | 4/2010 | Ferrini |
| 2010/0102340 A1 | 4/2010 | Ooya |
| 2010/0110098 A1 | 5/2010 | Wang |
| 2010/0117997 A1 | 5/2010 | Haase |
| 2010/0123155 A1 | 5/2010 | Pickett |
| 2010/0123839 A1 | 5/2010 | Lu |
| 2010/0155749 A1 | 6/2010 | Chen |
| 2010/0172138 A1 | 7/2010 | Richardson |
| 2010/0177091 A1 | 7/2010 | Hioki |
| 2010/0193806 A1 | 8/2010 | Byun |
| 2010/0207865 A1 | 8/2010 | Auld |
| 2010/0208172 A1 | 8/2010 | Jang |
| 2010/0208493 A1 | 8/2010 | Choi |
| 2010/0214282 A1 | 8/2010 | Whitehead et al. |
| 2010/0246160 A1 | 9/2010 | Ito |
| 2010/0283036 A1 | 11/2010 | Coe-Sullivan |
| 2010/0283072 A1 | 11/2010 | Kazlas |
| 2010/0289819 A1 | 11/2010 | Singh |
| 2010/0309217 A1 | 12/2010 | Greenebaum |
| 2011/0085168 A1 | 4/2011 | Phillips |
| 2011/0122170 A1 | 5/2011 | Kim |
| 2011/0176328 A1 | 7/2011 | Anandan |
| 2011/0205251 A1 | 8/2011 | Auld |
| 2011/0273495 A1 | 11/2011 | Ward |
| 2011/0299011 A1 | 12/2011 | Weiss |
| 2011/0312116 A1 | 12/2011 | Weiss |
| 2011/0317097 A1 | 12/2011 | Kim |
| 2012/0038286 A1 | 2/2012 | Hasnain |
| 2012/0050632 A1 | 3/2012 | Shih |
| 2012/0074851 A1 | 3/2012 | Erinjippurath |
| 2012/0075435 A1 | 3/2012 | Hovanky |
| 2012/0113672 A1* | 5/2012 | Dubrow ............ G02B 6/0068 362/602 |
| 2012/0147296 A1 | 6/2012 | Montgomery |
| 2012/0154417 A1 | 6/2012 | Ninan |
| 2012/0154422 A1 | 6/2012 | Ninan |
| 2012/0154464 A1 | 6/2012 | Ninan |
| 2012/0155060 A1 | 6/2012 | Whitehead |

(56) References Cited

U.S. PATENT DOCUMENTS

| | | |
|---|---|---|
| 2012/0274882 A1 | 11/2012 | Jung |
| 2012/0287381 A1 | 11/2012 | Li |
| 2012/0300465 A1 | 11/2012 | Chang |
| 2013/0050293 A1 | 2/2013 | Feng |
| 2013/0100692 A1 | 4/2013 | Yokobayashi |
| 2013/0201661 A1 | 8/2013 | Mehrle |
| 2013/0215136 A1 | 8/2013 | Jiao |
| 2013/0293596 A1 | 11/2013 | Atkins |
| 2013/0335677 A1 | 12/2013 | You |
| 2013/0342558 A1 | 12/2013 | Sasaki |
| 2014/0043847 A1 | 2/2014 | Yang |
| 2014/0078716 A1 | 3/2014 | Ninan |
| 2014/0231788 A1 | 8/2014 | Krall |
| 2016/0027368 A1 | 1/2016 | Guo et al. |

FOREIGN PATENT DOCUMENTS

| | | |
|---|---|---|
| CN | 1732717 | 2/2006 |
| CN | 1841471 | 10/2006 |
| CN | 1841487 | 10/2006 |
| CN | 201062757 | 5/2008 |
| CN | 101233751 A | 7/2008 |
| CN | 101243557 | 8/2008 |
| CN | 101322247 | 12/2008 |
| CN | 101425275 B | 5/2009 |
| CN | 101484841 | 7/2009 |
| CN | 102770897 B | 11/2012 |
| EP | 0154953 | 9/1985 |
| EP | 1521235 | 4/2005 |
| EP | 1579733 | 9/2005 |
| EP | 1922763 | 5/2008 |
| EP | 2365384 | 9/2011 |
| JP | 278393 | 3/1990 |
| JP | 2003346530 | 12/2003 |
| JP | 2004325647 | 11/2004 |
| JP | 2005258248 | 9/2005 |
| JP | 2006114909 | 4/2006 |
| JP | 2007058209 | 3/2007 |
| JP | 2008507735 | 3/2008 |
| JP | 2008096547 | 4/2008 |
| JP | 2008538145 | 10/2008 |
| JP | 2009251129 | 10/2009 |
| JP | 2009267239 | 11/2009 |
| JP | 2010525555 | 7/2010 |
| JP | 2012500996 | 1/2012 |
| JP | 2012505435 | 3/2012 |
| JP | 2013161053 | 8/2013 |
| KR | 20080041780 | 5/2008 |
| KR | 20110012246 | 2/2011 |
| KR | 20110072210 | 6/2011 |
| RU | 2456660 | 7/2012 |
| WO | 03021340 | 3/2003 |
| WO | 03058726 | 7/2003 |
| WO | 2004010406 | 1/2004 |
| WO | 2004032523 | 4/2004 |
| WO | 2004060024 | 7/2004 |
| WO | 2006107720 | 10/2006 |
| WO | 2007020556 | 2/2007 |
| WO | 2007114918 | 10/2007 |
| WO | 2009041574 | 4/2009 |
| WO | 2009041594 | 4/2009 |
| WO | 2009078426 | 6/2009 |
| WO | 2009101727 | 8/2009 |
| WO | 2010058162 | 5/2010 |
| WO | 2011031802 | 3/2011 |
| WO | 2012082825 | 6/2012 |
| WO | 2013188298 | 12/2013 |
| WO | 2014025677 | 2/2014 |
| WO | 2014137565 | 9/2014 |

OTHER PUBLICATIONS

NanocoTechnologies "The Future of Cadmium Free QD Display Technology" Apr. 2011.

Nanosys and LG Close to Bringing Quantun Dot Technology to LCD Displays, Nov. 4, 2010.

Quantum Dot LCD HDTV, Dec. 31, 2009.

* cited by examiner

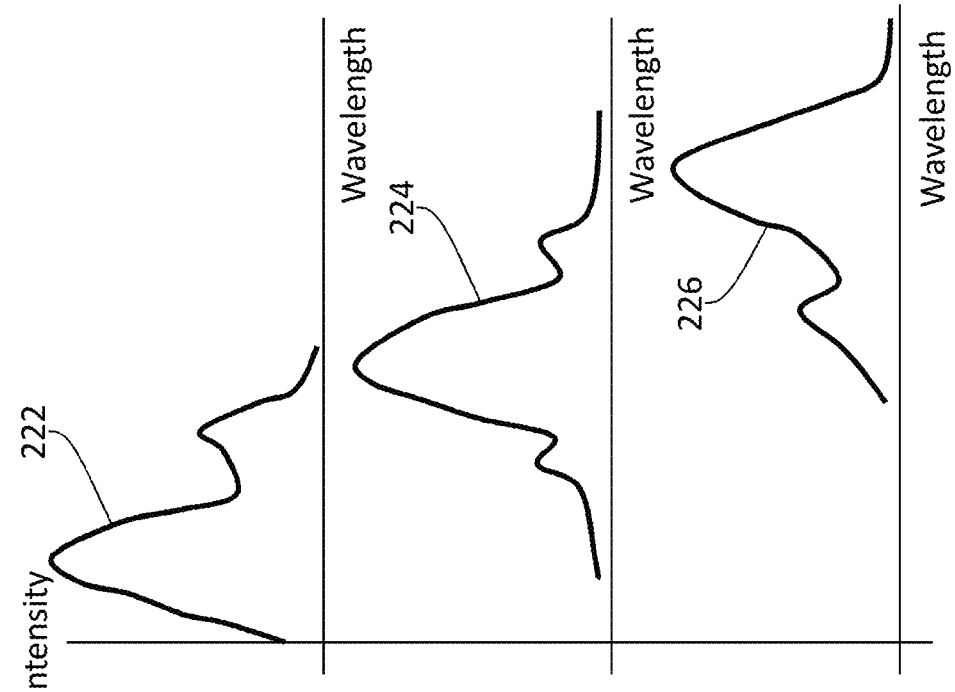
FIG. 2C
FIG. 2B
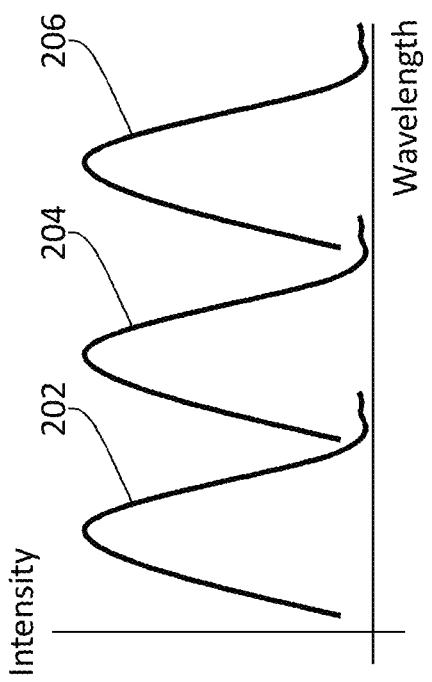
FIG. 2A
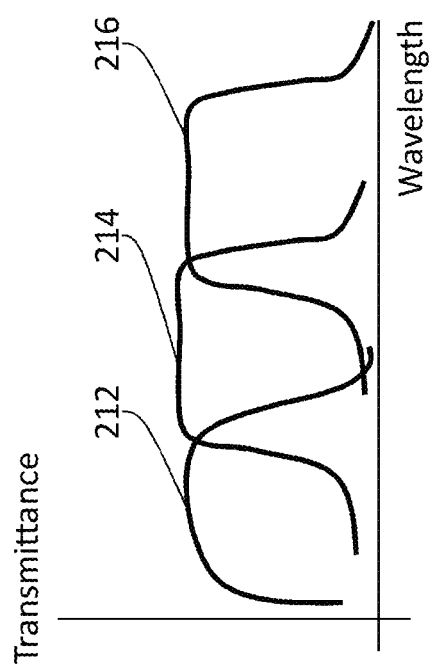

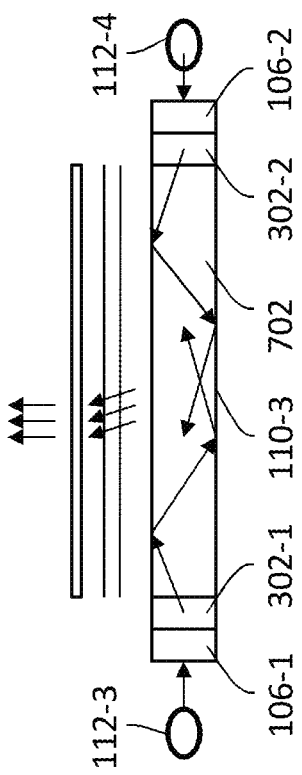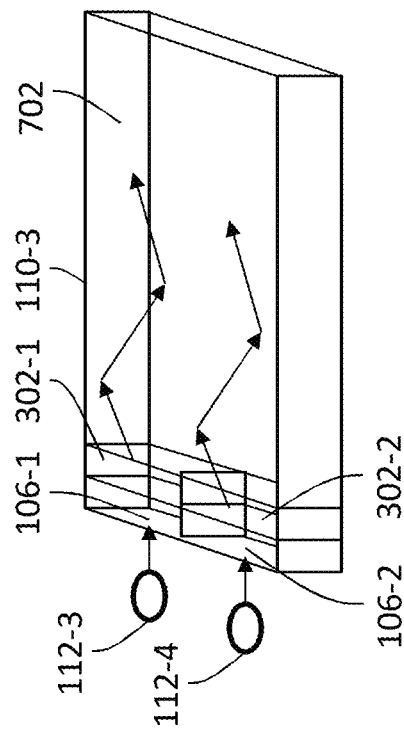
FIG. 7A
FIG. 7B

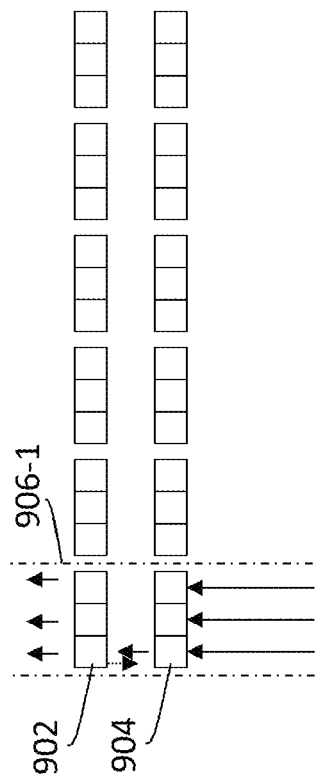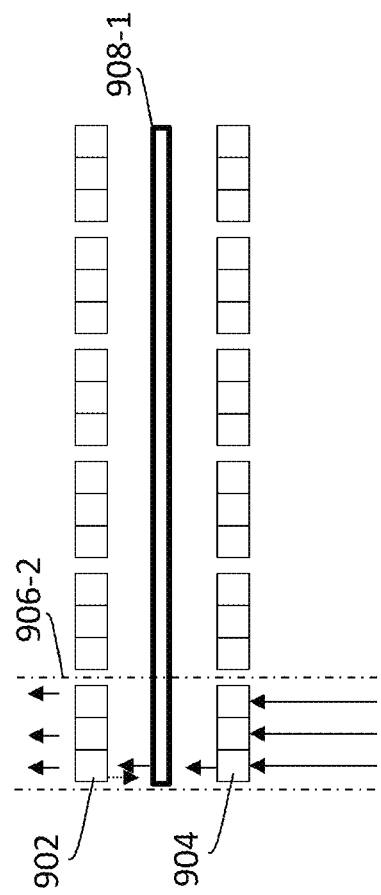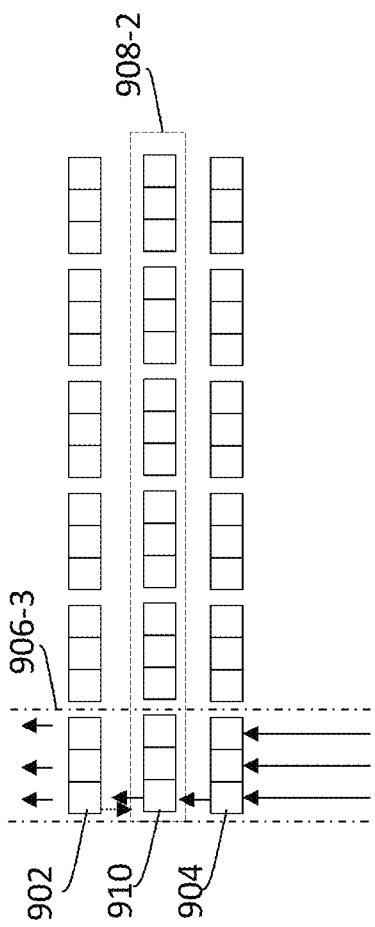

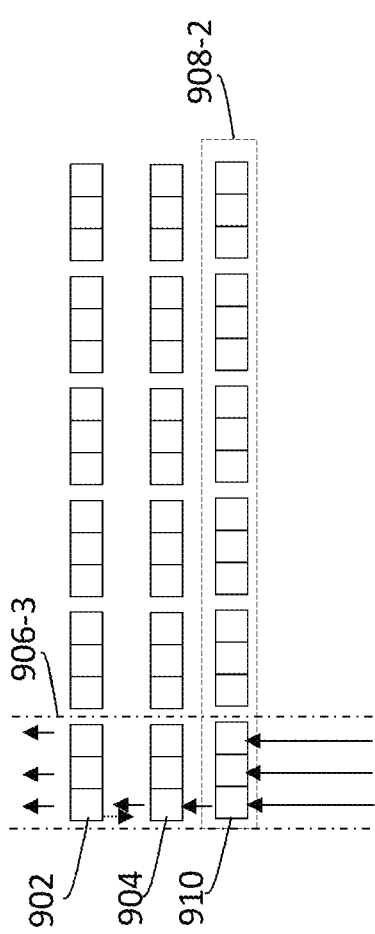

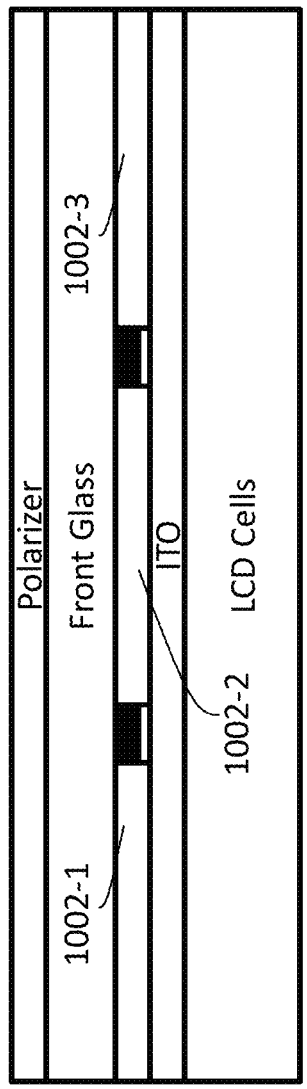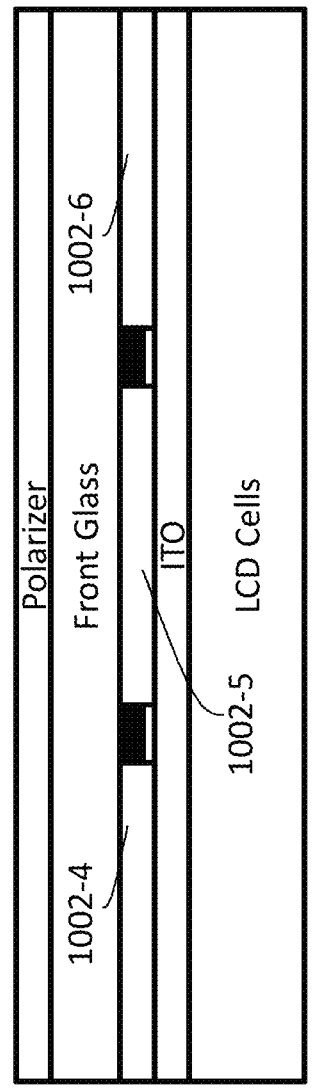

QUANTUM DOT/REMOTE PHOSPHOR DISPLAY SYSTEM IMPROVEMENTS

CROSS-REFERENCE TO RELATED APPLICATION

This application claims priority, as a continuation application, to U.S. patent application Ser. No. 15/596,564, filed May 16, 2017, which claims priority, as a continuation application, to U.S. patent application Ser. No. 14/030,896, filed Sep. 18, 2013, now U.S. Pat. No. 9,746,157, issued Aug. 29, 2017, which claims priority to United States Provisional Application No. 61/703,020 filed Sep. 19, 2012, the entire contents of which are incorporated by reference as if fully set forth herein, under 35 U.S.C. § 120. The applicants hereby rescind any disclaimer of claim scope in the parent applications or the prosecution history thereof and advise the USPTO that the claims in this application may be broader than any claim in the parent application(s).

TECHNOLOGY

The present invention relates generally to display techniques, and in particular, to display techniques using light regeneration materials.

BACKGROUND

Color filter arrays in LCD and OLED displays are commonly produced by photolithographic techniques, or printing techniques, as part of the LCD and OLED panel production process of the LCD or OLED.

Color filters in emissive displays such as LCD and OLED displays typically consist of red, green and blue filters. The color filters are patterned over the pixel array to allow the pixel elements to modulate the emitted light by color instead of only by intensity. In operation, a broadband light source provides light to pixel elements, for example, in LCD display systems. Alternatively, broadband light is created by white OLED pixel elements in OLED display systems. A pixel element can vary the intensity of the broadband light transmitting out of the pixel element. The intensity-modulated broadband light of each pixel element can be further color-filtered by overlaying color filter. Light is much wasted by color filters because, for example, in order to produce red light, green and blue light from the broadband light source would be blocked.

Additionally, since a typical display system comprises many passive light filtering components, much (e.g., over 95%) of the light generated by a light source in the display system is not only inefficiently wasted but also converted into harmful heat which degrades the performance and lifetime of the display system.

Thus, engineering a display system with wide color gamut and high luminance has been recognized as a costly endeavor by many display manufactures. Because of a high number of relatively expensive optical, audio, electronic and mechanical components involved and the complexity in integrating all of them into a single system, the cost of manufacturing a decent display system is typically very high.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 2A illustrates example transmittances versus wavelengths for color filters; FIG. 2B and FIG. 2C illustrate example spectral power distributions;

FIG. 7A and FIG. 7B illustrate example light units;

FIG. 9A through FIG. 9D illustrate example pixel structures; FIG. 10A through FIG. 10F illustrate additional example pixel structures;

DESCRIPTION OF EXAMPLE POSSIBLE EMBODIMENTS

Figure 1B:
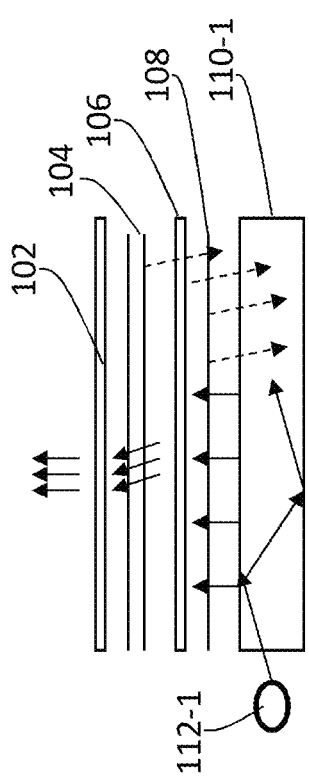
FIG. 1A through FIG. 1C illustrate example display system configurations.

Example possible embodiments, which relate to remote phosphor (RP)/quantum-dot (QD) based display improvement techniques, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:
1. GENERAL OVERVIEW
2. STRUCTURE OVERVIEW
3. NOTCH FILTERS
4. PASS BAND FILTERS 5. LIGHT SOURCES
6. PIXEL STRUCTURES
7. SHAPING SPECTRAL POWER DISTRIBUTIONS
8. COLOR ARRAY PANELS
9. LIGHT SOURCE CONTROL LOGIC
10. IMPLEMENTATION MECHANISMS—HARDWARE OVERVIEW
11. EQUIVALENTS, EXTENSIONS, ALTERNATIVES AND MISCELLANEOUS 1. General Overview This overview presents a basic description of some aspects of a possible embodiment of the present invention. It should be noted that this overview is not an extensive or exhaustive summary of aspects of the possible embodiment. Moreover, it should be noted that this overview is not intended to be understood as identifying any particularly significant aspects or elements of the possible embodiment, nor as delineating any scope of the possible embodiment in particular, nor the invention in general. This overview merely presents some concepts that relate to the example possible embodiment in a condensed and simplified format, and should be understood as merely a conceptual prelude to a more detailed description of example possible embodiments that follows below.

In a display system, light that renders an image to a viewer travels through many optical layers, modules, structures, components, etc., from light sources to the viewer, and constitutes only a portion of total light output from the light sources. A significant portion of the total light output fails to reach the viewer for a variety of reasons. In an example, if a pixel is to represent a red pixel value in an image to be rendered, light of non-red colors is rejected or absorbed for the pixel. In another example, if a pixel is to represent a relatively dark pixel value in an image to be rendered, much of light incident on a light modulation layer such as a liquid crystal cell of the pixel is not allowed to transmit through the light modulation layer, as the liquid crystal cell is set to a relatively less transparent state based on the relatively dark pixel value.

Light regeneration materials can be disposed with a display system to increase optical efficiencies of display systems, for example, as described in as described in U.S. Provisional Application No. 61/486,160, filed on May 13, 2011, entitled "TECHNIQUES FOR QUANTUM DOTS"; U.S. Provisional Application No. 61/486,166, filed on May 13, 2011, entitled "TECHNIQUES FOR QUANTUM DOT ILLUMINATIONS"; U.S. Provisional Application No. 61/486,171, filed on May 13, 2011, entitled "QUANTUM DOT FOR DISPLAY PANELS," the contents of which are hereby incorporated herein by reference for all purposes as if fully set forth herein.

A light regeneration layer can be stimulated not only by light from light sources but also recycled light. Shorter-wavelength light can be converted by the light regeneration layer into longer-wavelength light. For example, at least a portion of UV or blue light rejected along optical paths from the light sources to the viewer can be recycled into green or red light, which may be able to transmit through green or red color filters and reach the viewer.

However, a spectral power distribution of the recycled light that stimulates a light regeneration light is typically different from a spectral power distribution of light emitted by light sources. For example, the recycled light may contain relatively high amounts and local peaks of relatively low light wavelengths as compared with the light emitted by the light sources. Thus, even though increasing the amount of usable light, light recycling also can produce light of intermediate colors between primary colors of a display system. Consequently, even though maximum luminance for individual pixels may be increased with light recycling, light perceived by a viewer from those pixels contains the intermediate colors, which desaturate the primary colors and negatively impact wide gamut display operations.

Under techniques as described herein, intermediate colors produced in part by a light regeneration layer from recycled light can be removed by notch filters disposed in front of (closer to a viewer) the light regeneration layer. Notch filters can be configured to reject specific light wavelengths associated with the intermediate colors.

Color shift (e.g., white light tinted with yellow, etc.) caused by recycled light can be especially significant around central portions of point spread functions of light emitters in display systems using direct-lit light sources. As used herein, the term "direct-lit" refers to light injection by light emitters (e.g., LEDs, etc.) in a direction directly or substantially directly to a viewer. Additionally, optionally, or alternatively, intermediate colors that are caused in part by recycled light can be reduced or avoided by using pass band filters disposed behind (further from a viewer) a light regeneration layer. Pass band filters, which include but are not limited only to dichroic mirrors, can be configured to pass specific light wavelengths—for example—associated with light sources. The presence of pass band filters localizes light of the specific light wavelengths (e.g., UV light, blue light, associated with light sources, etc.) in a particular light recycling region on one side of the pass band filters, and confines light of other wavelengths (e.g., green, red, not associated with the light sources, etc.) on the other side of the pass band filters. As a result, typical optical paths from the light sources to the viewer are dominated less by recycled light of the other wavelengths, resulting in a significant reduction of color shift, especially in central portions of point spread functions of light emitters in a display system that uses direct-lit light sources.

Notch filters and pass band filters, in conjunction with light regeneration layers, may be used individually or in combination in a display system. These filters can also be deployed in different individual parts of a display system. In an example, either notch filters, or pass band filters, or both types of filters, can be implemented in conjunction with light regeneration layers in light sources. In another example, either notch filters, or pass band filters, or both types of filters, can be implemented in conjunction with (e.g., together with, etc.) light regeneration layers in one or more optical stacks between light units and light modulation layers. In a further example, either notch filters, or pass band filters, or both types of filters, can be implemented in conjunction with light regeneration layers in one or more optical stacks between a viewer and one or more light modulation layers; such optical stacks may, but are not limited to, be implemented as a part of a pixel structure comprising color filters and/or liquid crystal cells.

In some embodiments, light sources with notch filters and/or pass band filters can be used to generate light of multiple (e.g., two, etc.) independent sets of primary colors. Light of a primary color in a first set of primary colors and light of a corresponding primary color in a second set of primary colors can have narrow wavelength ranges and/or have little or no mutual overlap in light wavelengths. Accordingly, light of multiple sets of primary colors that have little or no mutual overlap in light wavelengths can be emitted simultaneously in a display system. The first set of primary colors can be used to render an image for a left eye perspective, while the second set of primary colors can be used to render a corresponding image for a right eye perspective. Both images may together form a 3-dimensional (3D) image at the same time or in a frame sequential manner. Thus, a viewer who wears 3D glasses with a left eye glass transparent to the first set of primary colors but opaque to the second set of primary colors and a right eye glass transparent to the second set of primary colors but opaque to the first set of primary colors can perceive the 3D image rendered simultaneously or in a frame sequential manner without needing to synchronize with image rendering operations of the display system.

In some embodiments, a method comprises providing a display system as described herein. In some possible embodiments, mechanisms as described herein form a part of a display system, including but not limited to a handheld device, tablet computer, theater system, outdoor display, game machine, television, laptop computer, netbook computer, cellular radiotelephone, electronic book reader, point of sale terminal, desktop computer, computer workstation, computer kiosk, PDA and various other kinds of terminals and display units.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Structure Overview

One or more light regeneration layers (films, sheets, etc.) can be used in an optical configuration of a display system. A light regeneration layer may, but is not limited to, be formed by adding QD, RP, or other light regeneration materials to an (e.g., existing or new) optical layer. Light regeneration materials may be coated, attached to, doped, or otherwise disposed on the top surface, the bottom surface, or both surfaces of the optical layer. Light regeneration materials may also be embedded within the optical layer. Light regeneration materials may be disposed with the optical layer in any combination or order of various disposition methods.

Figure 1C:
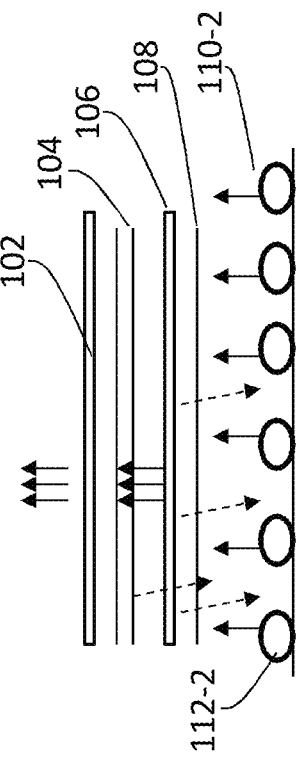
Figure 1A:
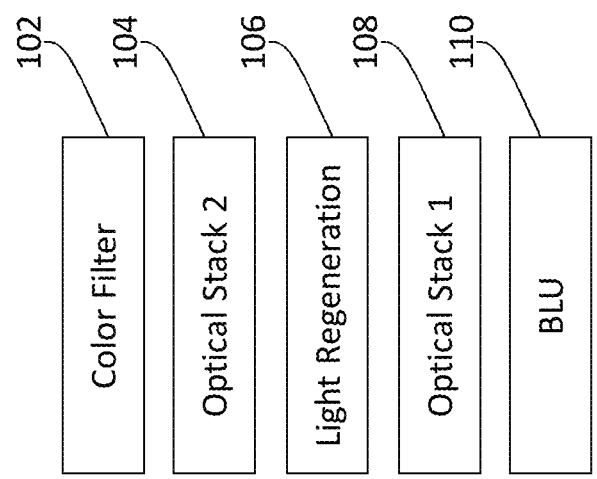

FIG. 1A illustrates an example display system configuration comprising a backlight unit 110 (BLU), optical stack 1 (108), a light regeneration layer 106, optical stack 2 (104), and a color filter layer (102). Pixel structures can be implemented in one or more of the illustrated layers in FIG. 1A. In an example embodiment, pixel structures that are used to modulate light intensity of transmissive light are embedded in the color filter layer (which may comprise filters of different colors for corresponding subpixels) and optical stack 2 (which may comprise liquid crystal unit structures for corresponding subpixels).

FIG. 1B illustrates an example side-lit display system configuration. FIG. 1C illustrates an example direct-lit display system configuration. In some embodiments, light sources as described in U.S. Provisional Application No. 61/681,870, filed on Aug. 10, 2012, entitled "LIGHT DIRECTED MODULATION DISPLAYS," the contents of which are hereby incorporated herein by reference for all purposes as if fully set forth herein, can be used with a display system as described herein. As illustrated in FIG. 1B, one or more light sources 112-1 are configured to inject light into a light guide in a BLU 110-1 in a side direction that is different from (e.g., perpendicular to) a light transmission direction in which pixels are illuminated by transmissive light in the side-lit display system. In contrast, as illustrated in FIG. 1C, one or more light sources 112-2 are configured to inject light into a light guide in a BLU 110-2 in a direction that is similar to (e.g., substantially aligned with) a light transmission direction in which pixels are illuminated by transmissive light in the direct-lit display system. Other light injection methods, including but not limited to those that combine both side-lit and direct-lit light injection methods, may also be used in a display system as described herein.

Light injected by a light source (e.g., 112-1, 112-2, etc.) as described herein may comprise one or more of a wide variety of light wavelength distribution patterns (spectral components of less than 1 nm, less than 5 nm, between 5 nm and 30 nm inclusive, greater than 30 nm, etc.). Injected light in a BLU 110 may include but is not limited to: one or more of blue light, violet light, ultraviolet light (including near (about 400-300 nm); middle (about 299-200 nm); far (about 199-122 nm)), etc.

In some embodiments, light sources 112-1 and 112-2 of FIG. 1B and FIG. 1C are configured to emit blue light; light regeneration layer 106 comprises light regeneration materials configured to convert blue light into green and red light.

Color filters in display systems (e.g., LCD display systems) can vary from vendor to vendor. In some embodiments, color filters can be preconfigured to absorb much of the light that does not have wavelengths in pass bands of the color filters. In some embodiments, color filters can be preconfigured to reject much of the light that does not have wavelengths in pass bands of the color filters. FIG. 2A illustrates example transmittances 212, 214, and 216 versus wavelengths for blue, green, and red color filters, respectively. Since color filters are typically optimized for light transmission and not color gamut, transmittances 212, 214, and 216 may have relatively large flat responses over relatively large wavelength ranges that overlap with one another. As a result, a color filter of a specific color (e.g., blue, green, red, etc.) tends to pass a mixture of colors other than the specific color, resulting in a desaturation of the specific color.

Light regeneration materials such as quantum dots can be selected to generate light in specific bandwidth widths. To some extent, light generation materials are typically cheaper when the bandwidth widths are wider. FIG. 2B illustrates example light spectral power distributions 202, 204, and 206 respectively for blue light from a light pump/emitter (e.g., LED, light sources 112-1, light sources 112-2, etc.), green light converted from the blue light by a light regeneration layer (e.g., 106), and red light converted from the blue light by light regeneration layer 106. It should be noted that other primary colors other than red, green, and blue colors may also be used. It should also be noted that more than three, three, fewer than three primary colors may be used in a color system adopted by a display system.

Light may be reflected or bounced around at interfaces of different types of light media in a display system as transmissive light travels from a BLU to a viewer (not shown) located at the top of FIG. 1A, FIG. 1B, and FIG. 1C. Additionally, optionally, or alternatively, light reflectors, light scatter elements, optical retardation films, optical wave plates, reflection enhancement films, prisms, etc., may be configured in a display system to recycle light. Some rejected light will be lost due to optical inefficiency, while some other rejected light can be recycled inside the light guide in the BLU (110-1) of the side-lit display system of FIG. 1B, in or at optical stack 1 (108), in or at light regeneration layer 106, in or at optical stack 2 (104), etc. The recycled light may be of a different light spectral power distribution (e.g., containing differentially attenuated/rejected intermediate colors between primary colors, etc.) than that of 202 of FIG. 2B, the latter of which represents the light spectral power distribution of blue light from a light pump/emitter (e.g., LED, light sources 112-1, light sources 112-2, etc.).

When recycled light is incident on the light regeneration layer 106, a portion of the recycled light will be converted by the light regeneration layer 106 to light of different (e.g., longer than that of incident light, etc.) wavelengths than those of the recycled light. A portion of converted/regenerated light may transmit through pixels to a viewer, while other portions of regenerated light may be further rejected and further recycled.

FIG. 2C illustrates example light spectral power distributions 222, 224, and 226, as viewed by a viewer through respective blue, green, and red color filters, taking into consideration recycled light. Primary color light as perceived by a viewer at the front of a display screen is not the saturated color light as represented by light spectral power distributions 202, 204, and 206, but rather is significantly desaturated color light as represented by light spectral power distributions 222, 224, and 226 that contain bumps (e.g., local peaks or lobes) of intermediate colors between the peaks of primary colors.

In some embodiments, light spectral power distributions 202, 204, and 206, as illustrated in FIG. 2B, which respectively correspond to blue light as emitted by light sources (e.g., 112-1, 112-2, etc.), green light as converted by light regeneration layer 106 from the blue light, and red light as converted by light regeneration layer 106 from the blue light may have little or no mutual overlaps in light wavelengths. In contrast, light spectral power distributions 222, 224, and 226, as illustrated in FIG. 2C, which respectively correspond to blue, green, and red light as transmitted through the color filters (e.g., in color filter layer 102) comprise significant mutual overlaps in light wavelengths. The mutual overlaps exist because actual light incident into or at light regeneration layer 106 comprises both blue light from light emitters and light rays that are being recycled. The (effective) light spectral power distribution stimulating light regeneration layer 106 may not be the same as that of light spectral power distribution 202 of the light sources (e.g., 112-1, 112-2, etc.). Blue light excites light regeneration materials such as quantum dots more easily than non-blue light and hence is converted to other colors of light more easily than non-blue light. In contrast, light of a non-blue color such as green and red light does not excite the light regeneration materials as much as the blue light, and hence is dispersed more widely than blue light, as light is being recycled in various parts of the display system. This can cause color shifts in, and yellow tails away from, central portions of point spread functions of light emitters. In an alternative embodiment, light spectral power distribution 202 can be that of a UV source, a broad light source, etc., converted into blue by light regeneration layer 106. Accordingly, in this alternative embodiment, the recycled light would then be the UV or broad light source, not blue.

3. Notch Filters

Figure 3B:
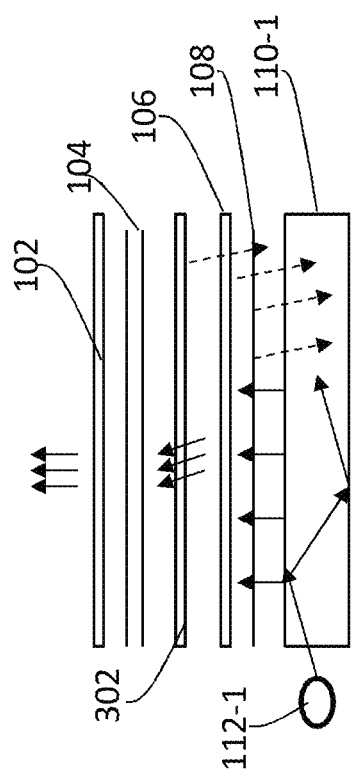
FIG. 3A through FIG. 3C illustrate example display system configurations relating to notch filters.
Figure 3C:
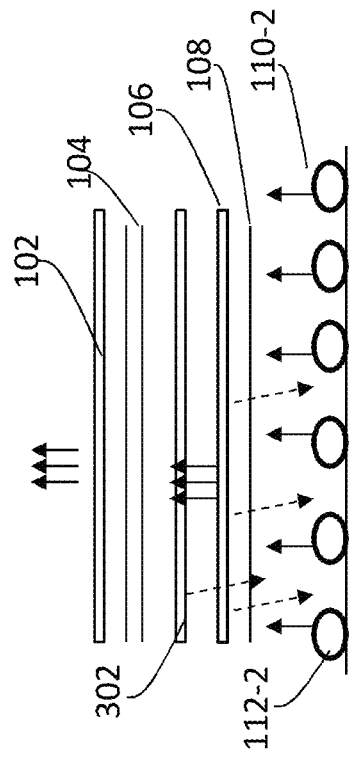
Figure 3A:
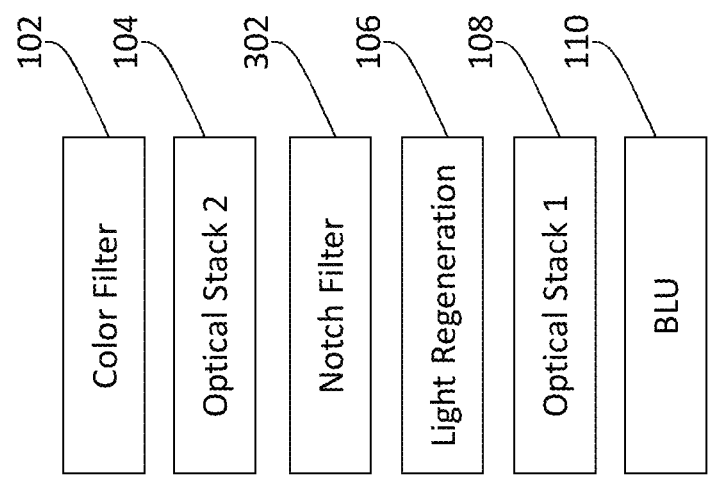

One or more notch filter layers (e.g., films, sheets, etc.) may be used in an optical configuration of a display system. FIG. 3A illustrates an example display system configuration comprising a BLU (110), optical stack 1 (108), a notch filter layer (302), a light regeneration layer (106), optical stack 2 (104), and a color filter layer (102). FIG. 3B illustrates an example side-lit display system configuration that comprises one or more notch filter layers (e.g., 302). FIG. 3C illustrates an example direct-lit display system configuration that comprises one or more notch filter layers (e.g., 302). FIG. 4A illustrates an example transmittance 402 of notch filter layer 302. Transmittance 402 of notch filter layer 302 is preconfigured with one or more notches (e.g., 404-1, 404-2, etc.). In an example, a notch (404-1) can be preconfigured in a bandwidth region between blue and green light spectral power distributions 202 and 204, or between blue and green transmittances 212 and 214. In another example, a notch (404-2) can be preconfigured in a bandwidth region between green and red light spectral power distributions 204 and 206, or between green and red transmittances 214 and 216. In some embodiments, a notch filter layer can be configured with additional optical properties other than notches in the transmittance response in specific wavelength ranges.

Other notches may also be configured in various possible implementations. For example, in embodiments in which UV light sources are used to create primary colors (e.g., red, green and blue) in a color system (e.g. an RGB system, an RGB+ system, etc.), blue light regeneration materials may be configured with a light regeneration layer (e.g., 106); one or more notches may be configured with a notch filter layer (e.g., 302) between UV wavelengths and blue light wavelengths.

In some embodiments, a notch filter layer (e.g., 302) is disposed above a light regeneration layer (e.g., 106), and is closer to the viewer than the light regeneration layer (106). The presence of notch filter layer 302 rejects or reduces transmission of light in wavelengths that correspond to the notches (e.g., 404-1, 404-2, etc.). Rejected light by notch filter layer 302 may be recycled and sooner or later either absorbed or converted into light in wavelengths that can be transmitted through notch filter layer 302.

Figure 4B:
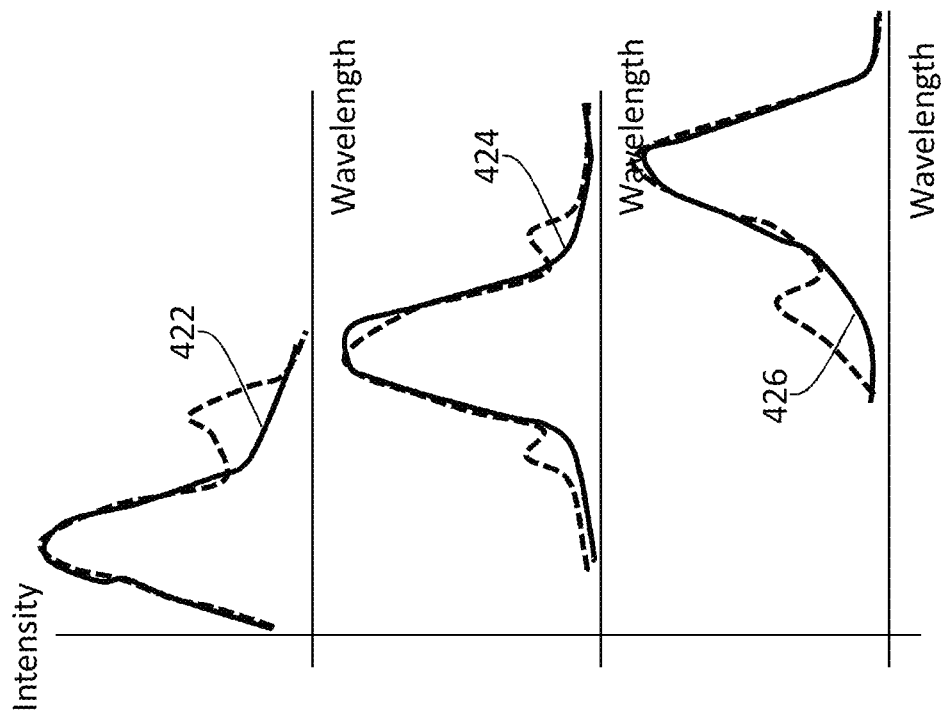
FIG. 4B illustrates an example light spectral power distribution with presence of notch filters.
Figure 4A:
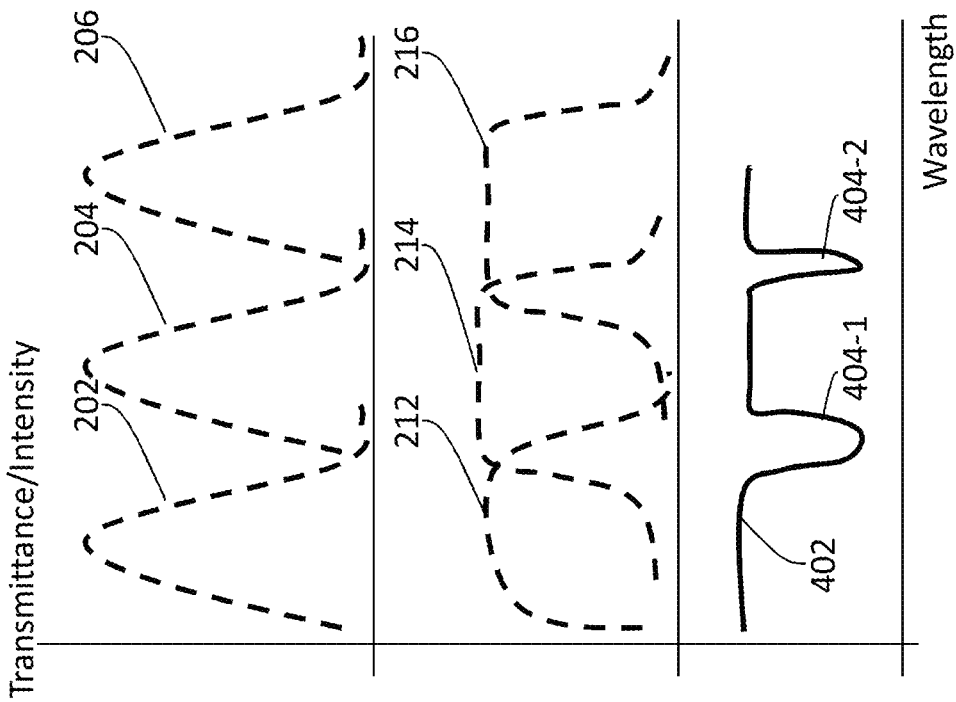
FIG. 4A illustrates example transmittances versus wavelengths for notch filters.

FIG. 4B illustrates example light spectral power distributions 422, 424, and 426 (denoted as solid curves), as viewed by a viewer through respective blue, green, and red color filters. Color light as perceived by a viewer is now a highly saturated color light, similar to those represented by light spectral power distributions 202, 204, and 206, instead of desaturated color light as represented by light spectral power distributions 222, 224, and 226 of FIG. 2C (denoted as dotted curves in FIG. 4B). For example, as illustrated in FIG. 4B, intermediate colors such as blue green and green red light, which exist in light spectral power distributions 222, 224, and 226 of FIG. 2C are rejected by notch filter layer 302. To avoid or reduce light loss, notch filter layer 302 may comprise a rejection sheet or another light rejection mechanism (e.g., dichroic mirrors, etc.) to direct rejected light away from the viewer for further light recycling. Since there is at least one light regeneration layer (e.g., 106, etc.) in the display system, when rejected light hits light regeneration layer 106, the rejected light is reconverted to light of longer wavelengths. Some light fits in the pass bands of notch filter layer 302 and color filter layer 102, goes through notch filter layer 302 and color filter layer 102, and produces saturated (or pure) colors to support wide color gamut display operations. Other light that (fits in the notches and) does not fit in the pass bands of notch filter layer 302 and color filter layer 102, repeats the light regeneration/reconversion process.

In some embodiments, a notch filter layer can be configured or preconfigured to filter as many light wavelengths in mutual overlaps between transmittances of different color filters as possible. In some embodiments, a notch filter layer can be designed based at least in part on further considerations relating to manufacturing processes, costs, color gamut requirements, etc.

Other methods of improving color saturation and supporting wide color gamut may be used in conjunction with the use of one or more notch filter layers. For example, light regeneration materials may be selected with wide separations between different primary colors (red, green, and blue, etc., in a RGB color system) in both injected and regenerated light. Light spectral power distributions of light sources may also be specifically tuned to reduce bumps that are to be filtered out by notch filter layers. In an example, stimulating light such as UV light, blue light, etc., emitted by light sources may be configured with (e.g., moved to, etc.) relatively short wavelengths away from green and red light spectral power distributions as regenerated by light regeneration layer 106 from the blue light. In another example, red light regenerated by light regeneration layer 106 may be configured with (e.g., moved to, etc.) relatively long wavelengths away from those regenerated by light regeneration layer 106.

4. Pass Band Filters

One or more band pass filter layers (films, sheets, etc.) may be used in an optical configuration of a display system. These band pass filters can be configured to pass light in one or more specific wavelength ranges (pass bands). In an example, the specific wavelength ranges may be in UV wavelength ranges for UV light sources if the UV light sources are used to excite light regeneration materials in the display system. In another example, the specific wavelength ranges may be in blue wavelength ranges for blue light sources if the blue light sources are used to excite light regeneration materials in the display system. If other light sources are used, the specific wavelength ranges may be selected to match wavelength ranges supported by the other light sources.

Figure 5B:
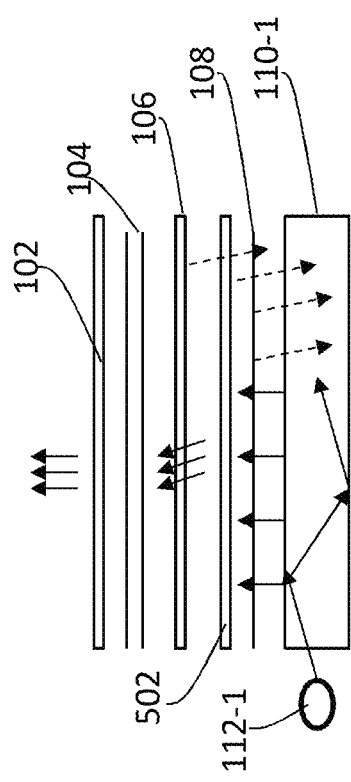
FIG. 5A through FIG. 5C illustrate example display system configurations relating to pass band filters.
Figure 5C:
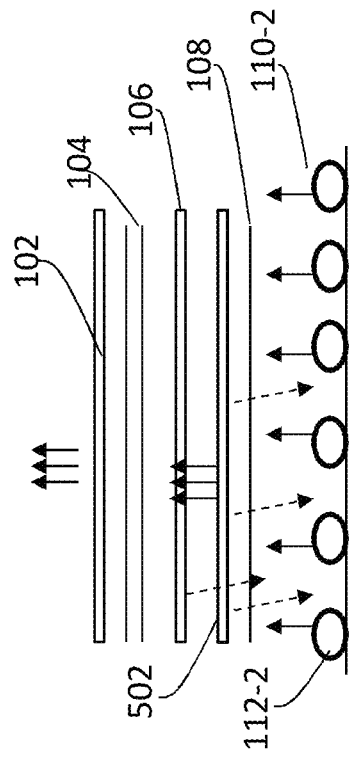
Figure 5A:
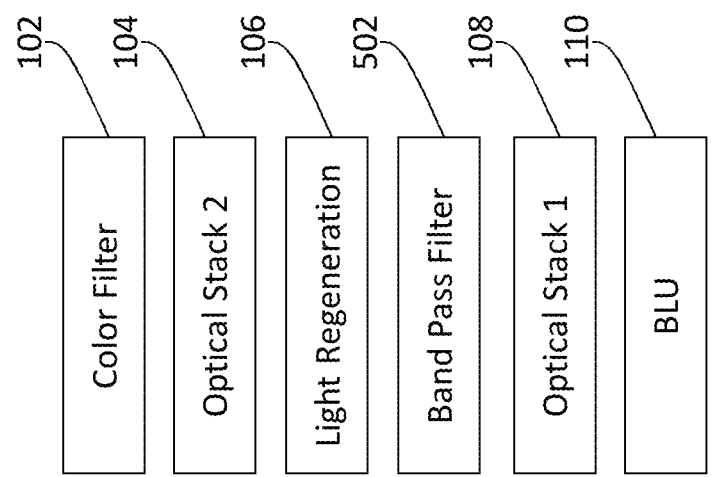
Figure 6:
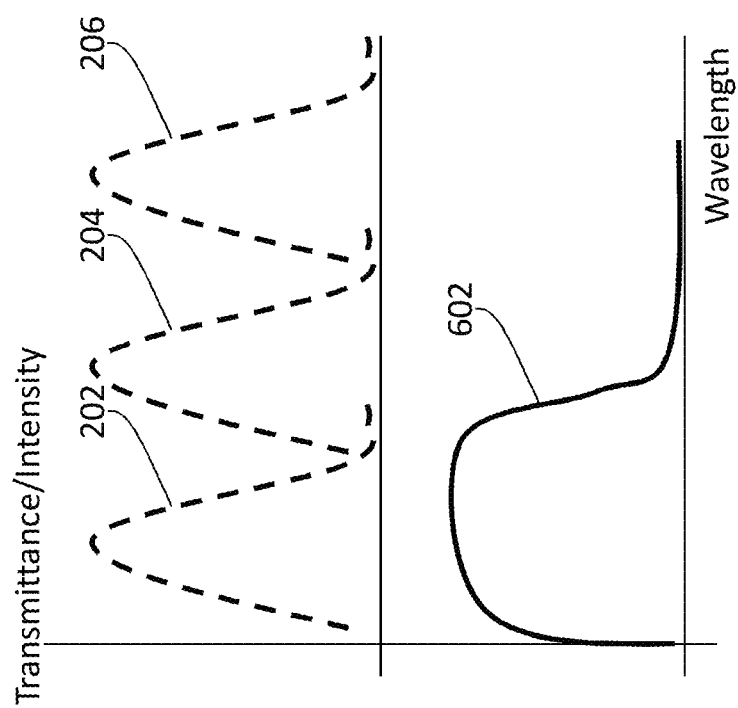
FIG. 6 illustrates an example transmittance versus wavelengths for pass band filters, in comparison with example light spectral power distributions of light sources and light regeneration materials.

FIG. 5A illustrates an example display system configuration comprising a BLU (110), optical stack 1 (108), a light regeneration layer (106), a band pass filter layer (502), optical stack 2 (104), and a color filter layer (102). FIG. 5B illustrates an example side-lit display system configuration that comprises one or more band pass filter layers (e.g., 502). FIG. 5C illustrates an example direct-lit display system configuration that comprises one or more band pass filter layers (e.g., 302). FIG. 6 illustrates an example transmittance 602 of band pass filter layer 502. Transmittance 602 of band pass filter layer 502 is preconfigured with one or more pass bands. In the illustrated embodiments in which blue light sources are used, a blue pass band is configured for transmittance 602 of band pass filter layer 502. Other pass bands may also be configured in various possible implementations. For example, in embodiments in which UV light sources are used to create primary colors (e.g., red, green and blue) in a color system (e.g. an RGB system, an RGB+ system, etc.), blue light regeneration materials may be configured with a light regeneration layer (e.g., 106); one or more pass bands may be configured with a band pass filter layer (e.g., 502) in UV wavelength ranges.

In some embodiments, a band pass filter layer (e.g., 502) is disposed below a light regeneration layer (e.g., 106), and is further away from the viewer than the light regeneration layer (106). Light from the BLU 110 initially passes through band pass filter layer 502. A portion of the initial light (e.g., blue, etc.) is converted by light regeneration layer 106 to green and red light, while the other portion of the initial light, which is not converted, passes through light regeneration layer 106 as blue light. Blue light and converted light may be transmitted to a viewer; or rejected, reflected and/or redirected back towards BLU 110. For example, red and green filters may reject one or more portions of initial and converted light away from the direction of a viewer and back toward BLU 110. Additional optical medium changes, if any, in optical paths towards the viewer may cause one or more portions of initial and converted light to be redirected toward BLU 110.

Due to the optical properties (e.g., transmittance 602) of pass band filter 502, only light in the pass bands pass through, while light not in the pass bands is rejected back. Thus, the presence of pass band filter 502 keeps white light above pass band filter 502, and light in specific pass bands below pass band filter 502. For example, in embodiments in which blue light sources are used, the presence of pass band filter 502 keeps white light above pass band filter 502, and blue light below pass band filter 502. Accordingly, light conversion is localized to a specific spatial region in which light not in the pass bands is trapped.

In embodiments in which UV light sources are used, only UV light passes into a light recycling region between pass band filter 502 and BLU 110. Color light regenerated from UV light is rejected by pass band filter 502 and redirect back towards the viewer. In embodiments in which blue light sources are used, only blue light passes into a light recycling region between pass band filter 502 and BLU 110. Other (e.g., green and red) color light is rejected by pass band filter 502 and redirected back toward the viewer. The presence of a band pass filter (502) recycles, and hence increases the amount of, converted light (as regenerated by a light regeneration layer (106)) toward the viewer. The converted light travels a much shorter optical path in reaching the viewer with the presence of the band pass filter than otherwise. Without the presence of a pass band filter, some portions of the converted light (e.g., non-UV light, non-blue light, etc.) would travel relatively long optical paths, be redirected back to spatial regions close to or in light sources, spatially spread into wide angles and areas, and cause color shifts (e.g., yellow tails) as the rejected converted light dispersed further away from light incident directions of the initial light from BLU 110. Without the presence of a pass band filter under techniques as described herein, color shift degradation may be especially noticeable or even visually prominent in a direct-lit system. In such a system, for example, the first pass light in the center of a point spread function of a direct-lit light emitter would be mostly converted but rejected light component would likely bounce back in and convert with less green and red as the distance from the center of the point spread function of the light emitter to out circumferences increases, giving rise to a color shift to the point spread function.

5. Light Sources

Techniques as described herein can be used to generate two or more sets of primary colors in a color system. In some embodiments, the two or more sets of primary colors at least comprise a first set of primary colors, for example, a first primary red color (R1), a first primary green (G1), a first primary blue (B1), etc., in a RGB or RGB+color system; and a second set of primary colors, for example, a second primary red color (R2), a second primary green (G2), a second primary blue (B2), etc., in the RGB or RGB+ color system.

FIG. 7A illustrates an example (front or back) light unit (110-3) comprising one or more first light sources (112-3) and one or more second light sources (112-4), one or more first light regeneration layers (106-1), one or more second light regeneration layers (106-2), one or more first filter layers (302-1), one or more second filter layers (302-2), and a light recycling region 702 (which may be a light guide in some implementations). Light sources (e.g., 112-3, 112-4, etc.) as described herein may be configured in any of the same side/wall, or more than one—e.g., two, three, four, etc.—side(s)/wall(s). For example, FIG. 7B illustrates an alternative configuration in which light sources 112-2 and 112-4 in light unit 110-3 are located along the same side/wall.

Light unit 110-3 can be configured to emit and/or regenerate more than one set of primary colors. Light recycling region 702 can be configured with one or more light directing components to direct the generated and regenerated light in light recycling region towards a viewer of a display system that operates with light unit (110-3).

In some embodiments, light unit 110-3 is configured to generate the first and second sets of primary colors as mentioned above. The one or more first light sources (112-3), the one or more first light regeneration layers (106-1) and the one or more first filter layers (302-1) are configured to generate or regenerate the first set of primary colors, whereas the one or more second light sources (112-4), the one or more second light regeneration layers (106-2) and the one or more second filter layers (302-2) are configured to generate or regenerate the second set of primary colors.

In some embodiments, the one or more first light sources (112-3) are configured to emit blue light of a wavelength composition that covers wavelengths of the first blue light (B1); the one or more first light regeneration layers (106-1) are configured to regenerate red light of a wavelength composition that covers wavelengths of the first red light (R1) and green light of a wavelength composition that covers wavelengths of the first green light (G1). In some embodiments, the one or more second light sources (112-4) are configured to emit blue light of a wavelength composition that covers wavelengths of the second blue light (B2); the one or more second light regeneration layers (106-2) are configured to regenerate red light of a wavelength composition that covers wavelengths of the second red light (R2) and green light of a wavelength composition that covers wavelengths of the second green light (G2). In various embodiments, other permutations (color composition) of initial light from light emitters and converted light (color composition) from light regeneration materials may be used to generate the first and second sets of primary colors.

Figure 8:
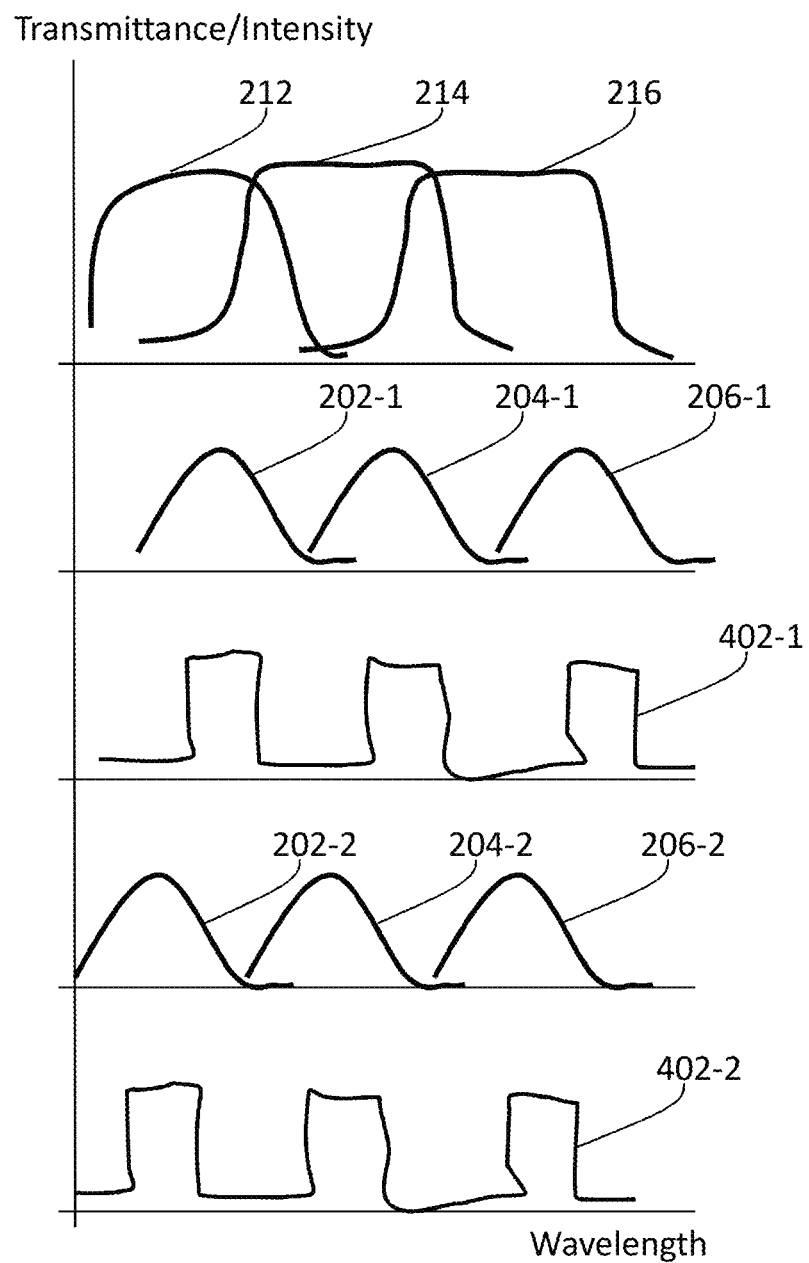
FIG. 8 illustrates example light spectral power distributions one or more sets of light sources.

FIG. 8 illustrates example light spectral power distributions 202-1 and 202-2 generated by first light sources (112-3) and second light sources (112-4), respectively; example light spectral power distributions 204-1 and 204-2 generated by first light regeneration layers (106-1) and second light regeneration layers (106-2), respectively; example light spectral power distributions 206-1 and 206-2 generated by first light regeneration layers (106-1) and second light regeneration layers (106-2), respectively; and example transmittances 402-1 and 402-2 of first filter layers 302-1 and second filter layers 302-2, respectively. It should be noted that techniques as described herein for 3D or non-3D display operations may be used with a wide variety of color filters including those (which, for example, may be of transmittances 212, 214 and 216 of FIG. 2A) that have mutual overlaps in bandwidths.

In some embodiments, transmittance 402-1 of first filter layers 302-1 is configured or preconfigured with one or more first opaque or low transmittance ranges (e.g., first notches, etc.). In an example, the first low transmittance ranges can be configured or preconfigured between first blue and green light spectral power distributions 202-1 and 204-1 and between first green and red light spectral power distributions 204-1 and 206-1. Likewise, transmittance 402-2 of second filter layers 302-2 can be configured or preconfigured with one or more second opaque or low transmittance ranges (e.g., second notches, etc.). In an example, the second low transmittance ranges can be configured or preconfigured between second blue and green light spectral power distributions 202-2 and 204-2 and between second green and red light spectral power distributions 204-2 and 206-2.

Other types of filters may also be configured or preconfigured in various possible implementations. For example, in embodiments in which UV light sources are used to create sets of primary colors (e.g., red, green and blue) in a color system (e.g. an RGB system, an RGB+ system, etc.), two different types of blue light regeneration materials may be configured with light regeneration layers (e.g., 106-1 and 106-2) in addition to different types of green light regeneration materials and different types of red light regeneration materials; opaque or low transmittance regions may be configured with filter layers (e.g., 302-1 and 302-2) between UV wavelengths and different types of blue light wavelengths in addition to opaque or low transmittance regions between respective different colors in the two sets of primary colors.

Additionally, optionally, or alternatively, pass band filter layers may be provisioned between light sources (112-3, 112-4, etc.) and light regeneration layers (302-1, 302-2, etc.). These pass band filter layers can increase efficiency by trapping/retaining converted light from the light regeneration layers (302-1, 302-2, etc.) within light recycling region 702 so that the converted light can be redirected in light recycling region 702 to a viewer.

Using filter layers as illustrated in FIG. 7A and FIG. 7B, primary colors as viewed by a viewer through respective blue, green, and red color filters are now highly saturated color light. Overlapped wavelengths and/or notches as illustrated in FIG. 2C that cause desaturated primary colors are avoided or significantly reduced, resulting in much improvement in wide color gamut display operations.

Two different sets of primary colors, each of which comprises a full set of primary color in a color system, can be used to support 3-dimensional (3D) display operations. A first set of primary colors (e.g., R1, G1, B1, etc.) can be used to render a left view image, while a second set of primary colors (e.g., R2, G2, B2, etc.) can be used to render a right view image. The left view and right view images together form a 3D image.

In some embodiments, light wavelengths of the first set of primary colors (R1, G1 and B1) have no or little overlapping with light wavelengths of the second set of primary colors (R2, G2 and B2). A viewer may wear a pair of glasses with a left perspective configured to be transmissive for one set in the first and second sets of primary colors but opaque for the other set in the first and second sets of primary colors, and with a right perspective configured to be opaque for the one set in the first and second sets of primary colors but transmissive for the other set in the first and second sets of primary colors. Under techniques as described herein, synchronization between a viewer's glasses and image rendering operations of a 3D display system is not needed in 3D display applications.

6. Pixel Structures

One or more light regeneration layers can be integrated in a display system outside pixel structures (e.g., disposed outside or inside a light unit), as well as inside pixel structures. FIG. 9A illustrates an example pixel structure comprising a plurality of pixels (one of which is pixel 906-1). For the purpose of illustration only, pixel 906-1 comprises three subpixels each of which comprises a color filter (e.g., 902) and a liquid crystal cell (904). Color filter 902 is a part of a color filter array, whereas liquid crystal cell 904 is a part of liquid crystal cell array. Liquid crystal cell 904 is configured to modulate white transmissive light directed at a viewer along the up direction of FIG. 9A. The modulated white transmissive light subsequently hits color filter 902, which may be configured to impart a primary color such as red color in a RGB or RGB+ color system. A portion of modulated white transmissive light becomes filtered light (e.g., red light) directed at the viewer, while the remaining portion (e.g., blue light, green light, a portion of red light, etc.) of modulated white transmissive light is absorbed and/or rejected by color filter 902. Thus, a significant amount (>>50%) of light is lost, resulting in an optically inefficient display system.

FIG. 9B illustrates an example pixel structure comprising a plurality of pixels (one of which is pixel 906-2) configured with a light regeneration layer 908-1 between color filters and liquid crystal cells. Light regeneration layer 908-1 is configured with light regeneration materials to convert incident light of certain wavelengths into regenerated light of certain other wavelengths. For example, light regeneration layer 908-1 comprises a homogeneous composition/structure configured to convert UV into blue, green and red light, convert blue light into green light, convert blue light into red light, and/or convert green light into red light. Additionally, optionally, or alternatively, light regeneration layer 908-1 comprises a black matrix similar to, or as an extension of, that of the color filter array. The black matrix can be configured to prevent light leakage between different subpixels and/or between different pixels.

In a first implementation example, similar to that of FIG. 9A, liquid crystal cell 904 of FIG. 9B is configured to receive and modulate white transmissive light directed at a viewer along the up direction. The modulated white transmissive light subsequently hits light regeneration layer 908-1. Light regeneration layer 908-1 is configured to regenerate green and red light from a portion of the modulated white light (e.g., blue and/or green light) and to pass the remaining portion of the modulated white light. The passed portion of the modulated white light and regenerated green and red light hit color filter 902, which may be configured to impart a primary color such as red color in a RGB or RGB+ color system. A portion of incident light at color filter 902 becomes filtered light (e.g., red light) directed at the viewer, the remaining portion (e.g., blue light, green light, a portion of red light, etc.) of the incident light, other than the filtered light or light loss due to absorption, as rejected by color filter 902, is at least partially recycled and converted to usable light (e.g., red light for the subpixel comprising color filter 902 and liquid crystal cell 904) by light regeneration layer 908-1, resulting in an optically efficient display system relative to a display system of FIG. 9A.

In a second implementation example, liquid crystal cell 904 is configured to receive and modulate blue transmissive light directed at a viewer along the up direction of FIG. 9A. The modulated blue transmissive light subsequently hits light regeneration layer 908-1. Light regeneration layer 908-1 is configured to regenerate green and red light from a portion of blue light and to pass the remaining portion of blue light. Blue light and regenerated green and red light hit color filter 902, which may be configured to impart a primary color such as red color in a RGB or RGB+ color system. A portion of incident light at color filter 902 becomes filtered light (e.g., red light) directed at the viewer, while the remaining portion of the incident light is absorbed and/or rejected by color filter 902. The incident light not lost to absorption, as rejected by color filter 902, is at least partially recycled and converted to usable light (e.g., red light for the subpixel comprising color filter 902 and liquid crystal cell 904) by light regeneration layer 908-1, resulting in an optically efficient display system relative to a display system of FIG. 9A.

In a third implementation example, liquid crystal cell 904 of FIG. 9B is configured to receive and modulate UV light directed at a viewer along the up direction. The modulated UV transmissive light subsequently hits light regeneration layer 908-1. Light regeneration layer 908-1 is configured to regenerate blue, green and red light from the modulated UV light and other incident light (e.g., UV, blue and/or green light). The regenerated blue, green and red light hits and at least partially passes through color filter 902, which may be configured to impart/pass a primary color such as red color in a RGB or RGB+ color system. A portion of incident light at color filter 902 becomes filtered light (e.g., red light) directed at the viewer, the remaining portion (e.g., blue light, green light, a portion of red light, etc.) of the incident light, other than the filtered light or light loss due to absorption, as rejected by color filter 902, is at least partially recycled and converted to usable light (e.g., red light for the subpixel comprising color filter 902 and liquid crystal cell 904) by light regeneration layer 908-1, resulting in an optically efficient display system relative to a display system of FIG. 9A.

FIG. 9C illustrates an example pixel structure comprising a plurality of pixels (one of which is pixel 906-2) configured with a light regeneration layer 908-2 between color filters and liquid crystal cells. Light regeneration layer 908-2 is configured with light regeneration materials to convert incident light of certain wavelengths into regenerated light of certain other wavelengths. For example, light regeneration layer 908-2 comprises a patterned composition/structure, which corresponds to the subpixel or pixel structure of the color filters and the liquid crystal cells. A light regeneration unit 910 (in light regeneration layer 908-2) that corresponds to color filter 902 and liquid crystal cell 904 in a red subpixel or pixel can be configured to convert other light such as UV, blue and/or green light into red light. A light regeneration unit (in light regeneration layer 908-2) in a green subpixel or pixel can be configured to convert other light such as UV and/or blue light into green light. A light regeneration unit (in light regeneration layer 908-2) in a blue subpixel or pixel can be configured to convert other light such as UV light into blue light and/or pass blue light. Additionally, optionally, or alternatively, light regeneration layer 908-1 comprises a black matrix similar to, or as an extension of, that of the color filter array. The black matrix can be configured (e.g., with opaque metallic or non-metallic materials, light regeneration materials that generate invisible infrared light, etc.) to prevent light leakage between different subpixels and/or between different pixels.

Liquid crystal cells in FIG. 9C may be illuminated by one or more of different types of transmissive light (e.g., UV light, blue light, etc.). Due to the presence of light regeneration layer 908-2, the remaining portion of the incident light, other than the filtered light or light loss due to absorption, as rejected by the color filter, is at least partially recycled and converted to usable light by light regeneration layer 908-2, resulting in an optically efficient display system relative to a display system of FIG. 9A. FIG. 9D illustrates an alternative example pixel structure to the pixel structure depicted in FIG. 9C. The light regeneration layer 908-2 may be placed below the liquid crystal cells and the color filters. Thus, the liquid crystal cells and the color filters form a LCD panel. The light regeneration layer 908-2 comprises a pixel structure in which light regeneration units of different colors are aligned respectively with color filters of the different colors. Also, there can be (optionally) intervening layers (e.g., BEF/DBEF, etc.) above or under the light regeneration layer. It should be noted that the rectangular shapes used in FIG. 9C and FIG. 9D to represent light regeneration units are for illustration purposes only. Other shapes may be used to implement the light regeneration units. In some embodiments, for example, shapes of light regeneration units in a light regeneration layer as described herein can be configured to be lenticular in order to focus/collimate light towards color filters.

Additionally, optionally, or alternatively, a black matrix as described herein, may be configured with light regeneration materials that convert blue, green and/or red light into longer wavelengths (e.g., wavelengths of invisible light such as infrared, etc.) and hence prevent light leakages between different subpixels and/or between different pixels. In some embodiments, a black matrix is disposed between color filters in a color filter array. The black matrix may be configured with light regeneration materials that convert visible light to invisible light such as infrared light in addition to, or in place of, light absorption materials. Light leaked through a liquid crystal cell (e.g., in a closed state, in a dark state, etc.) may be diverted to the black matrix. One or more light diverting mechanisms can be configured in a pixel structure to divert light from dark state liquid crystal cells to the black matrix in order to produce deeper black levels in subpixels or pixels that represent dark pixel values in image data to be rendered in a display system.

Additionally, optionally, or alternatively, light regeneration materials used in a light regeneration layer as described herein may be configured to create wideband colors, medium band colors, narrow band colors, combinations of the foregoing, etc. For example, liquid regeneration materials can be selected to emit narrow band color light configured to support wide color gamut or 3D display applications.

Additionally, optionally, or alternatively, notch filters and pass band filters may be configured with a light regeneration layer implemented in subpixel or pixel structures such as illustrated in FIG. 9B and FIG. 9C. These notch filters and pass band filters may be used to improve optical efficiency and/or color gamut, to produce saturated colors, to support 3D display applications, etc.

FIG. 10A illustrates an example pixel with color filters (1002-1, 1002-2 and 1002-3) covering red, green and blue subpixels in the pixel. A transparent conductive layer such as an ITO film may be formed over color filters 1002-1, 1002-2 and 1002-3. Color filters and a black matrix that separates color filters of different subpixels may be patterned in stripes using photolithography. Color filters 1002-1, 1002-2 and 1002-3 may be formed or disposed on or near a front substrate (e.g., glass, etc.). The front substrate (along with another substrate between Liquid crystal cells and a BLU may be used to encapsulate Liquid crystal materials in the Liquid crystal cells. The Liquid crystal cells may be illuminated with white light. Color filters 1002-1, 1002-2 and 1002-3 may comprise passive color pigments supporting high contrast display operations.

FIG. 10B illustrates an example pixel with color and colorless filters (1002-4, 1002-5 and 1002-6) covering red, green and blue subpixels in the pixel. Color filters 1002-4 and 1002-5 comprise red and green light regeneration materials, respectively; and cover red and green subpixels in the pixel, respectively. Colorless filter 1002-6 (e.g., a transparent binder material) may be used to cover a blue subpixel in the pixel. The Liquid crystal cells may be illuminated with blue light instead of white light.

Figure 10C:
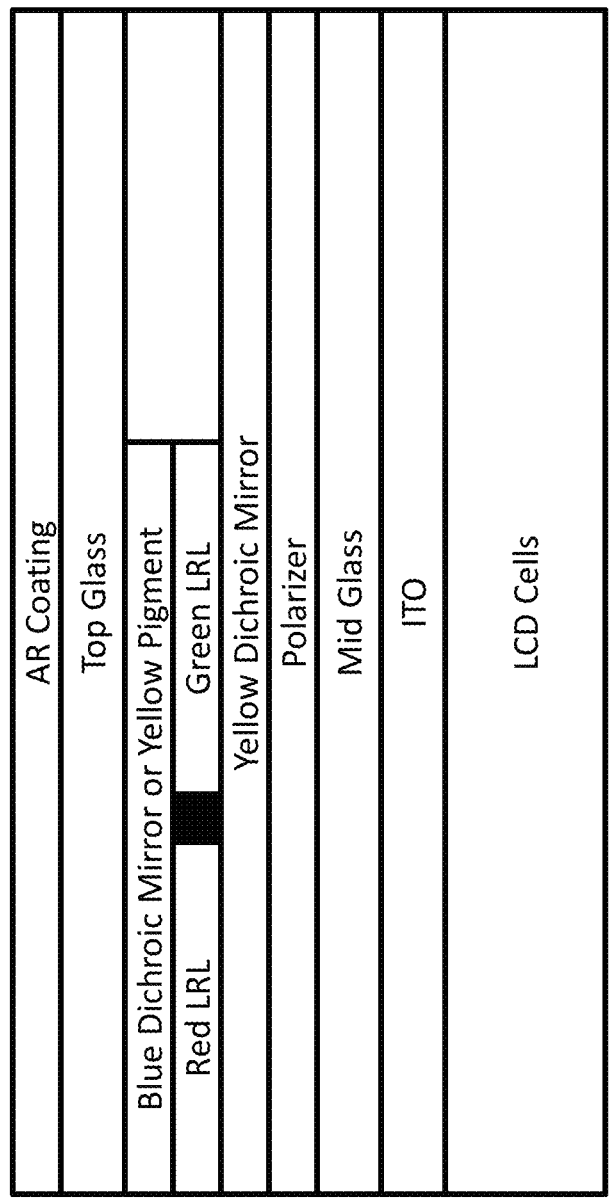

FIG. 10C illustrates an example pixel. An ITO layer may be patterned on a mid-glass with a polarizer layer on top of the mid-glass. A top (contiguous) filter layer comprising a blue dichroic mirror or yellow pigments is disposed or formed near or above a red light regeneration layer (red LRL) and a green light regeneration layer (green LRL). The red and green LRLs can emit light in all directions; however, the top filter layer can be configured (e.g., with light-redirecting microstructures, etc.) to redirect red and green light in the forward direction (along the up direction of FIG. 10C). A bottom (contiguous) filter layer comprising a yellow dichroic mirror is disposed or formed near or under the red LRL, the green LRL and a transparent layer in a blue pixel of the pixel. The bottom filter layer is configured to pass blue light and hence has no filtering effect in the blue subpixel. In some embodiments, black matrix elements may, but do not need to, be present around the transparent layer in the blue subpixel. The top filter layer absorbs ambient light incident from the top, and prevents or lessens stimulations of the light generation materials in the red and green LRLs; otherwise, the stimulations of the light generation materials in the red and green LRLs by ambient light would cause a rise in lowest achievable dark level which would in turn reduce contrast in display operations. The placements of polarizer layers and anti-reflection (AR) layers are depicted for illustration purposes only. Other placement choices or spatial arrangements other than that depicted in FIG. 10C or other figures may be used. In some embodiments, one or more transparent materials may be disposed above the bottom filter layer in the blue pixel of the pixel.

Figure 10D:
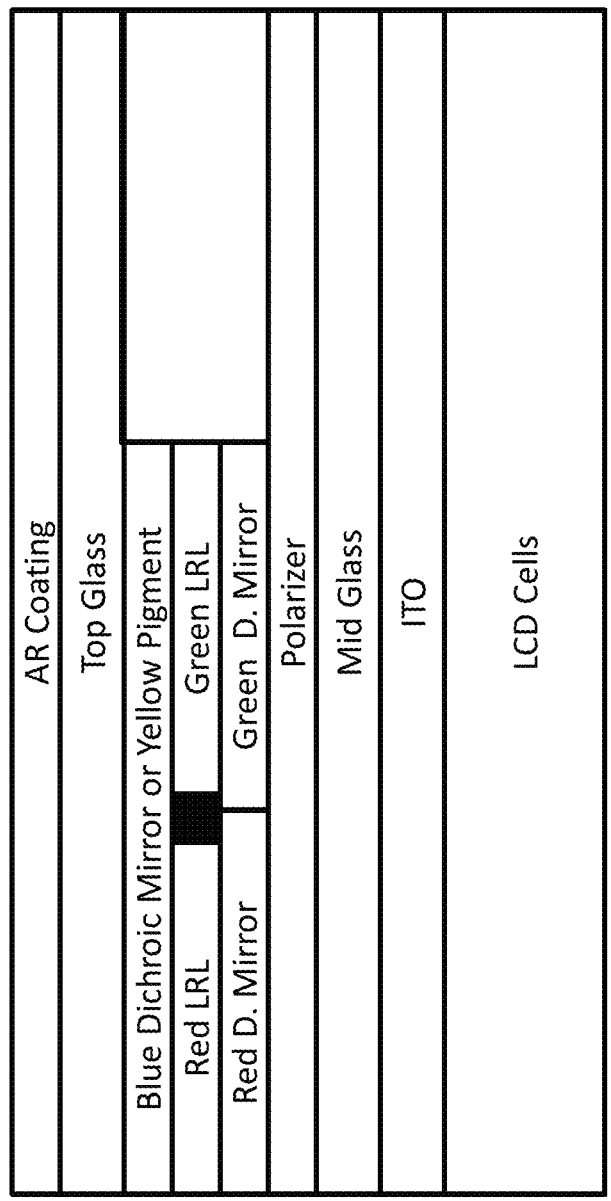

FIG. 10D illustrates an alternative configuration to that of the pixel depicted in FIG. 10C. The pixel of FIG. 10D comprises two separate red and green dichroic mirrors in red and green subpixels, respectively, instead of a yellow dichroic mirror for both red and green subpixels as illustrated in FIG. 10C. Transmittances of red and green dichroic mirrors can be adjusted to narrow frequency bands of light regenerated by the red and green LRLs, in order to improve color gamut in a display system which implements the pixel configuration of FIG. 10D.

Figure 10E:
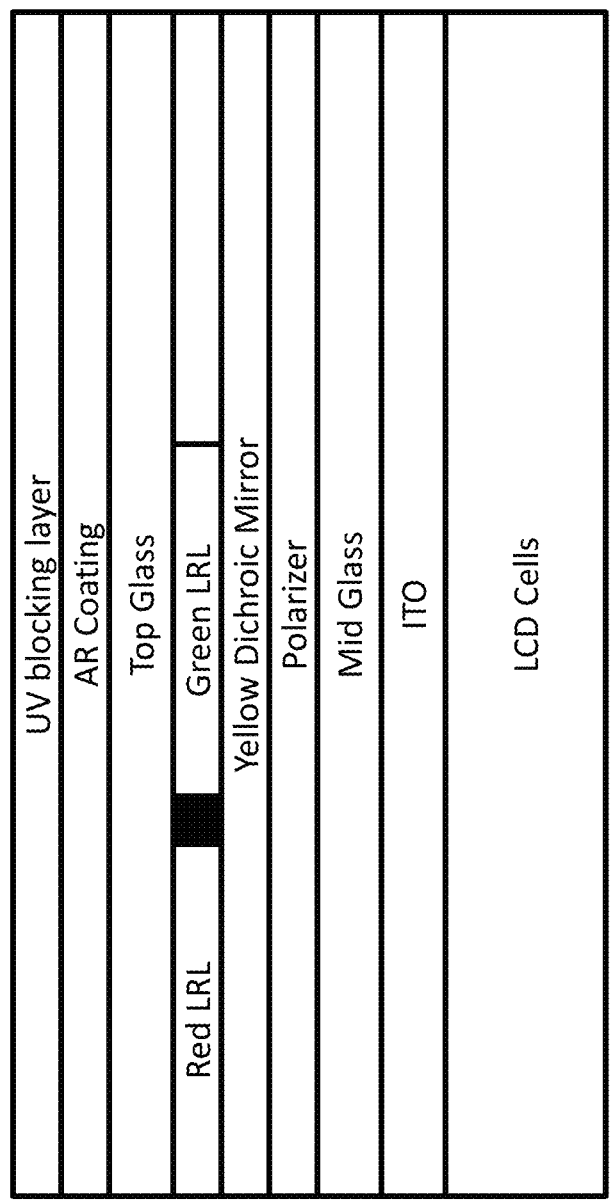

FIG. 10E illustrates an alternative configuration to that of the pixel depicted in FIG. 10C. The pixel of FIG. 10E comprises a UV blocking layer at least in red and green subpixels, instead of a yellow dichroic mirror in red and green subpixels as illustrated in FIG. 10C. The UV blocking layer prevents ambient light from stimulating the red and green LRL. This reduces light emissions from the red and green LRL caused by ambient light when modulated transmissive light is at the lowest level (lowest achievable dark level). Accordingly, both contrast and dynamic range in display operations can be improved.

Figure 10F:
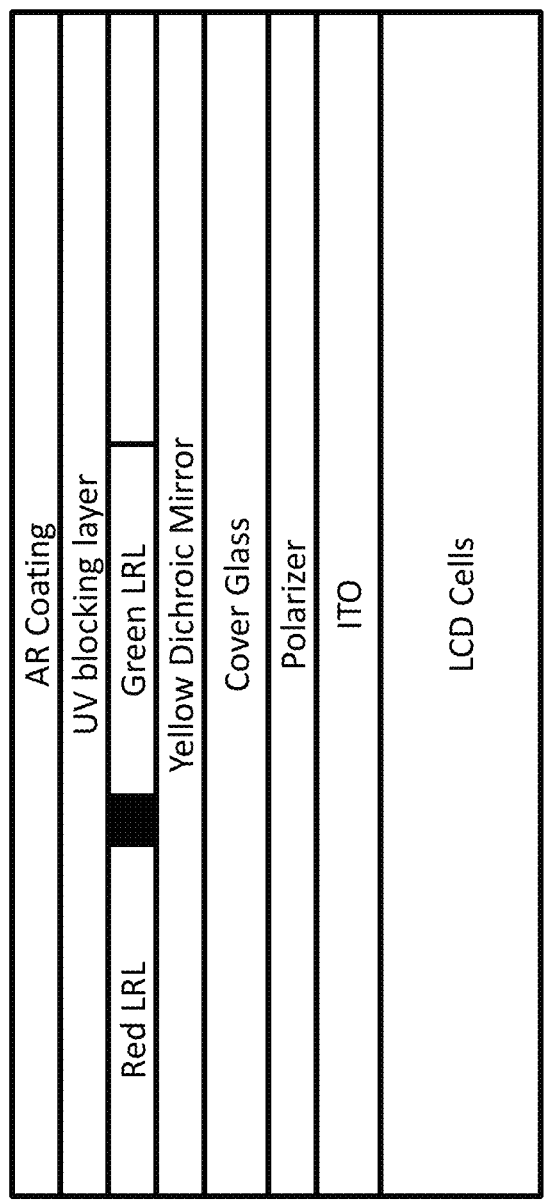

FIG. 10F illustrates an alternative configuration to that of the pixel depicted in FIG. 10C. The top glass of FIG. 10C is replaced with a UV blocking layer. The top filter layer of FIG. 10C is removed. As in FIG. 10E, the presence of the UV blocking layer reduces light emissions from the red and green LRL caused by ambient light when modulated transmissive light is at the lowest level (lowest achievable dark level). Accordingly, both contrast and dynamic range in display operations can be improved. The pixel configuration of FIG. 10F is likely a low cost solution to make and to produce relatively high contrast.

As described herein, a substrate or glass (e.g., the top glass, cover class, etc.) can be relatively thin to avoid or reduce cross talk or light leakage (for both stimulating and stimulated light). A substrate or glass may be implemented in a large TV size using a Gorilla type or other types of substrates or glasses. Additionally, optionally, or alternatively, yellow dichroic mirrors may be coated on a cover glass followed by color filters and a smoothing layer.

It should be noted that display system configurations, light unit configurations and pixel configurations in figures herein are provided for illustration purposes only. Other configurations, permutations, combinations, types of components or layers, etc., may be used in implementing techniques as described herein.

For projection and display purposes it can be desirable to have control over the spectral power distribution (SPD) of a light source. In common approaches, the SPD of a light source is fixed, for example, due to the light source's physical or chemical composition. Even when using an RGB LED system, only the relative intensities of component LEDs' SPDs can be changed, but not the distribution of the whole power spectrum (e.g., shifting the peak wavelength of one of the LEDs).

Under techniques as described herein, a light regeneration layer (e.g., a spatial gradient quantum dots sheet/film, light regeneration materials of specific spectral distributions and densities/concentrations, etc.) may be used to shape the SPD of a light source. The approach under these techniques does not have the limitations of other approaches, since the SPD of the light source can be shaped arbitrarily under the approach by using spatial light modulating device and a light regeneration layer, which for example may be configured to convert spatially modulated light into spectrally modulated light, as will be further discussed in detail.

The same techniques can be used to de-speckle lasers by widening a narrow bandwidth SPD of a laser-based light source into light of a broader bandwidth SPD. Particularly, a narrow band light from a laser source can be converted by quantum dots to a wider band collimated light.

7. Shaping Spectral Power Distributions

Figure 11:
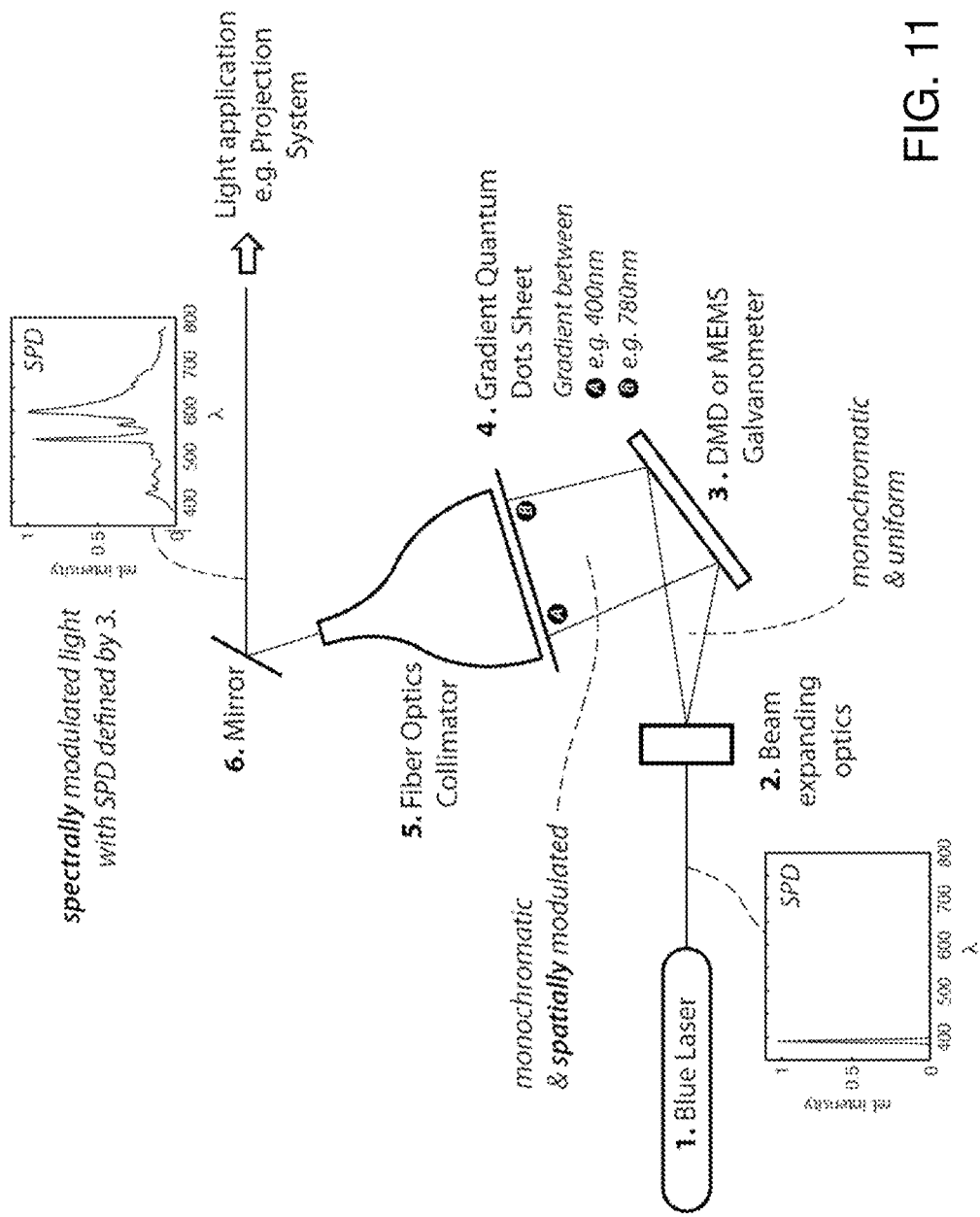
FIG. 11 illustrates an example of shaping a spectral power distribution from a narrow band laser source.

FIG. 11 illustrates shaping SPD with light from a narrow band laser source. A short wavelength laser (e.g. blue) shown in Step 1 emits a narrow band (monochromatic) beam. This beam is (e.g., uniformly, non-uniformly, etc.) widened in Step 2 and projected onto a spatial light modulating device shown in Step 3—which can be a digital mirror device or DMD, etc. Additionally, optionally, or alternatively, a laser scanning device, which can be a galvanometer, moving/oscillating MEMS device, etc.—may be used in place of, or in addition to, beam expanding optics in Step 2 to spatially modulate the blue laser beam. The DMD or galvanometer can be 1D or 2D, depending on the required complexity as well as energy throughput of the system.

The spatially modulated light is projected on a gradient quantum dot sheet (Step 4). 'Gradient' in this context means that the regenerated light wavelength properties of the quantum dots vary spatially over the area of the sheet. For example, for monochromatic blue laser light hitting the left side of the sheet (A), the quantum dot properties could be set to convert to 400 nm while the same input light can be converted to 780 nm on the right side of the sheet (B). Spatial areas in-between A and B can cover the wavebands in-between 400 and 780 nm. It should be noted that the spatial quantum dot gradient does not have to be uniform or even monotonically increasing. Instead, any kind of gradient distribution is possible such as a weighting of primary colors in regenerated light used in digital projection systems or having wider wavebands at any given spatial position. For example, areas close to side A can convert the input monochromatic laser light to CIE illuminant A, while areas close to side B can convert the input monochromatic laser light to CIE illuminant D65, thereby optimizing the total energy throughput of the system. The light leaving the gradient quantum dots sheet is now spectrally modulated as a function of the spatial setup of the galvanometer or DMD described in Step 3.

The gradient quantum dot sheets may scatter the output light into different spatial directions or direction ranges to some extent. The scattered light can be collimated again to avoid or reduce energy loss and to improve efficiency. This can be achieved using a fiber optics collimator illustrated in Step 5. In some embodiments, the spatial orientation and position may no longer be critical; any kind of light collimation (e.g., lenses, mirrors, different forms of total inner reflection, etc.) can be implemented. In some embodiments, the desired output of the light system is a spatially uniform beam of light that has a desired SPD defined by the spatial setting of the galvanometer or DMD. The mirror shown in Step 6 is a broadband mirror to reflect the light back into the optical path direction of the original laser but can also be left out or replaced with other optical elements such as lenses or optical filters.

Example SPDs are illustrated in FIG. 11. As shown, the narrow band width blue laser beam is converted to an SPD of a CCFL light source.

An alternative form to using a complex spatial light modulation device such as galvanometer or DMD is using a light path switch which can for example be used to physically switch the laser beam to a particular (uniform, not gradient) area on a quantum dot sheet. With this alternative approach, changing the white point of a display system, for example from D65 to D50, can be implemented without sacrificing light energy as it would be commonly the case under other approaches that do not implement the techniques as described herein.

Techniques as described herein can be implemented in projection systems or in back-lit systems. As the spatial composition of the gradient quantum dots sheet can be flexibly optimized to a specific display application, the light source can be very efficient and thus cost effective.

Efficiency can be improved by using quantum dot color arrays or phosphor color arrays instead of color filter arrays that are used to impart colors in color display systems. A red quantum dot or phosphor material absorbs light of higher energies or shorter wavelengths such as green and blue light and emits red light. A green quantum dot or phosphor material absorbs blue light and emit green light. Higher system efficiency can be achieved by replacing the (passive pigment-based) red filter with red quantum dot or red phosphor materials, the green filter with green quantum dot or green phosphor materials, and the blue filter with a clear filter, operating in conjunction with a display system backlit with blue LEDs or with a display system using blue OLED. Instead of producing broadband light and then blocked by the color filters to produce the desired colors, the red and green light can be emitted by converting from blue light source and blue light is emitted directly without filtering from the blue light source.

Quantum dots and phosphors may be processed by photolithographic techniques. Color filter materials could be inert or passive pigments or dyes that are mixed into photoresist materials in the photolithographic process during color filter construction. In contrast, quantum dots and phosphor materials tend to be active, sensitive to environment and surround chemicals. Various techniques including but not limited to any of: printing techniques, photolithographic techniques, etc., can be used to deposit the quantum dot or phosphor into color array patterns.

8. Color Array Panels

Techniques as described herein can be used to construct color array panels having strips of quantum dots or phosphors by processing thin sheets of materials having quantum dots or phosphors.

Figure 12:
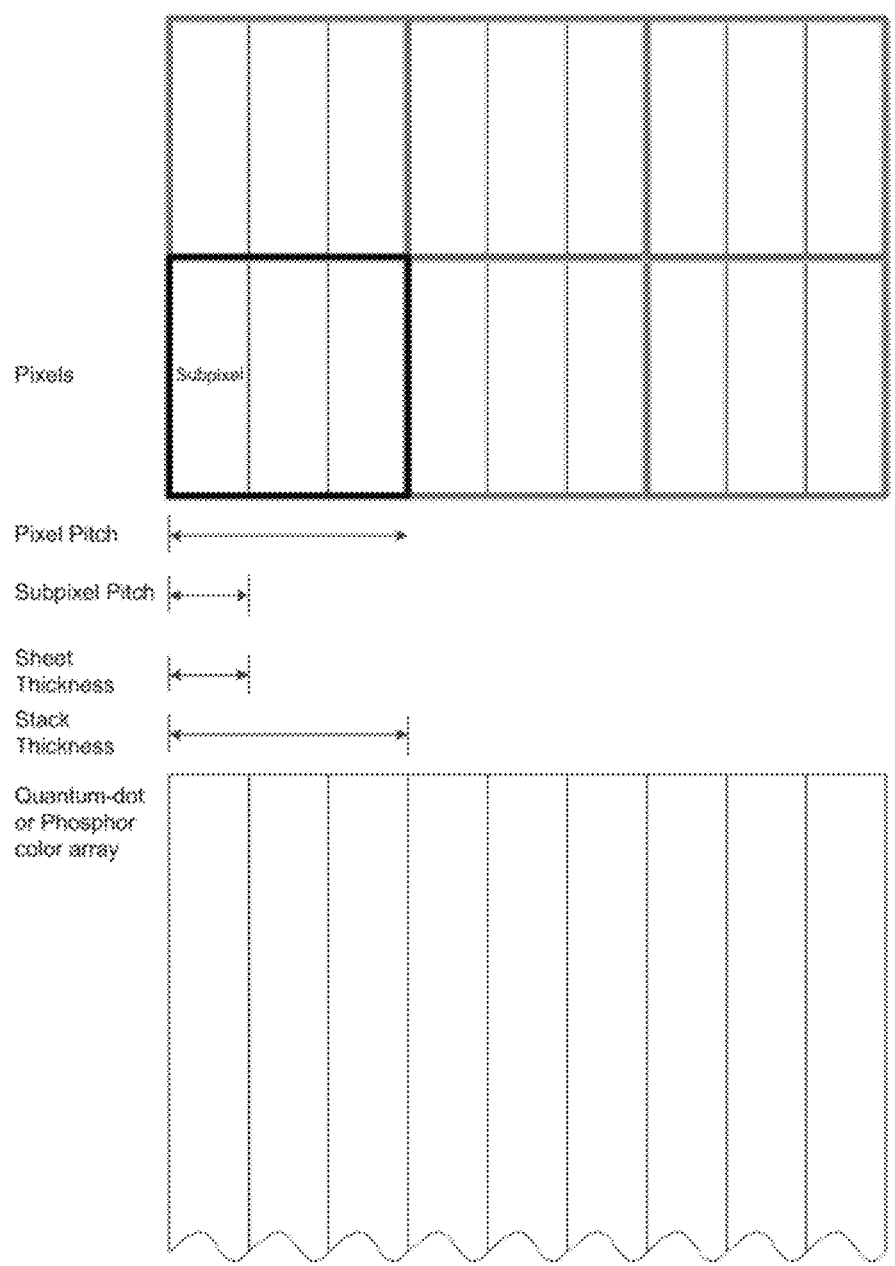
FIG. 12 illustrates an example configuration in which light regeneration sheets are stacked.

In some embodiment, sheets of materials having sheet thicknesses that match the subpixel pitch of a target display where each pixel contains multiple subpixels that can be stacked in sequence to construct a color array panel. A first sheet contains red quantum dot or phosphor materials and is referred to as Sheet R. A second sheet contains green quantum dot or phosphor materials and is referred to as Sheet G. A passive filler sheet without quantum dots or phosphors is referred to as Sheet W. FIG. 12 illustrates an example configuration in which the sheets are stacked in a sequence of Sheet R, Sheet G and Sheet W, wherein respective sheet thicknesses of Sheet R, Sheet G and Sheet W match the respective subpixel pitches of red, green and blue subpixels of pixels.

Figure 13:
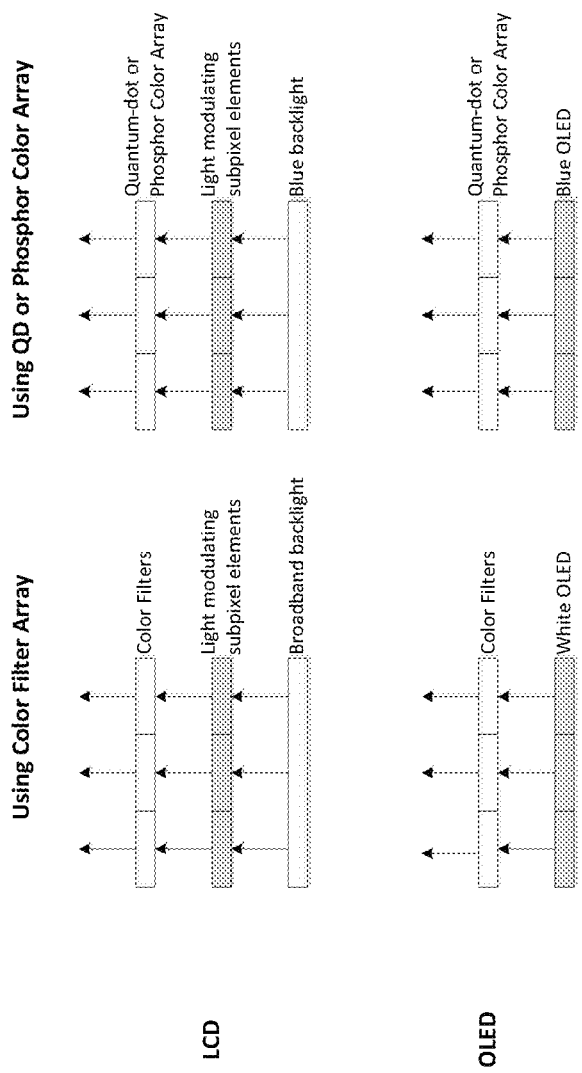
FIG. 13 illustrates an example color array panel comprising quantum dot or phosphor materials.

The color array panel may be used to replace the color filter array in a color LCD or OLED display. System efficiency can be improved significantly by reducing wasted light. In an example, an LCD panel can be manufactured as a monochrome panel backlit by blue backlight and without color filters. In another example, an OLED display can be constructed as a blue OLED panel only instead of white OLED with color filters. The color array panel comprising quantum dot or phosphor materials can be added in front of (as illustrated in FIG. 13), behind the monochrome LCD panel, or even behind an optical film (e.g., Dual Brightness Enhancement Films (DBEF), reflective polarizers, etc.). Similarly, for an OLED display, the color array panel comprising quantum dot or phosphor materials can be added in front of (as illustrated in FIG. 13).

Figure 14:
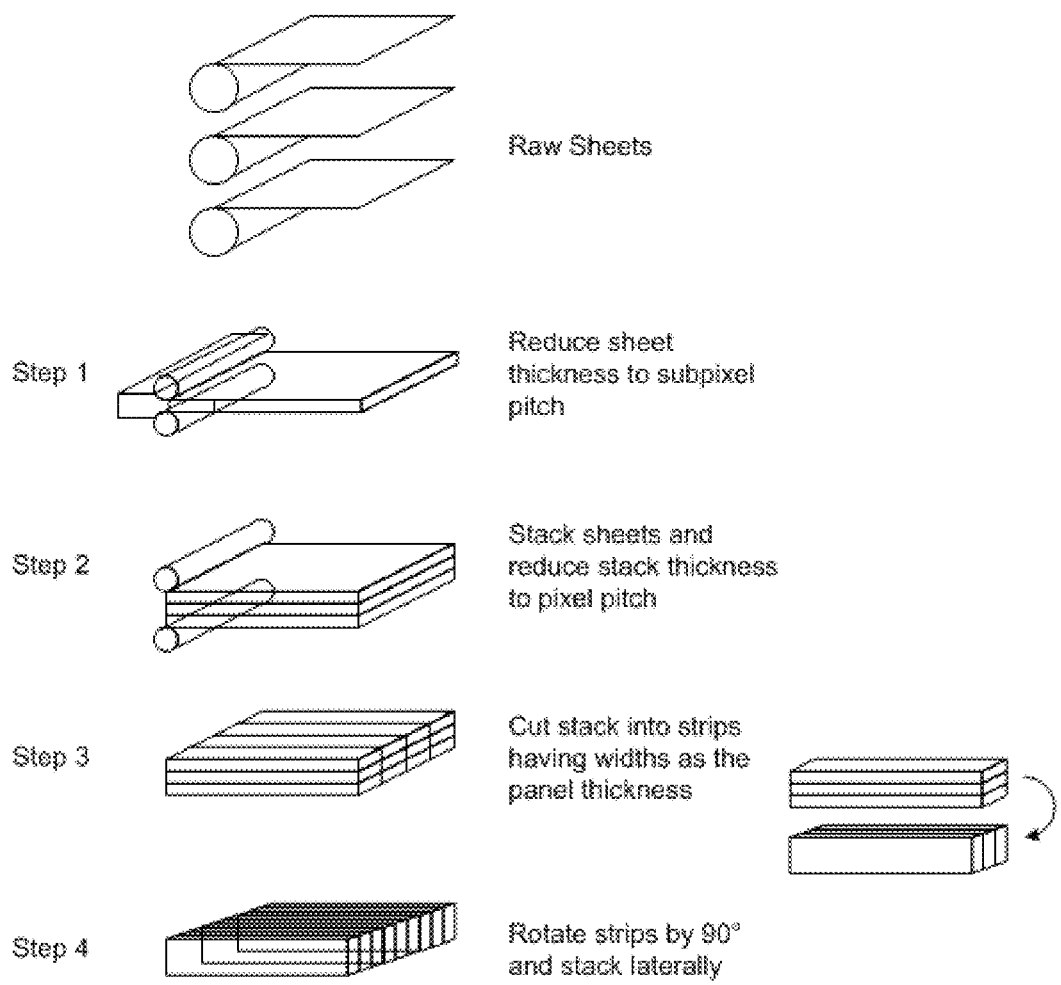
FIG. 14 illustrates example steps in constructing a color array panel.

FIG. 14 illustrates example steps in constructing a color array panel as described herein. In Step 1 of FIG. 14, raw sheets are reduced to thicknesses that match target subpixel pitches. This step may be accomplished by passing the sheets through heated rollers. Operational parameters such as roller temperature, roll rate, roller separation, etc., may be controlled by industrial control system to achieve the target thicknesses. Examples of raw sheets include but are not limited to: plastics containing quantum dots or phosphors. Step 1 of FIG. 14 is applied to all of different color sheets containing quantum dots or phosphors as well as filler sheets which do not contain any quantum dots or phosphors.

In Step 2 of FIG. 14, the sheets processed by Step 1 of FIG. 14 are stacked in a desired sequence (e.g., matching the sequence of different color subpixels) and bonded. A stack thickness equals the total thickness contributed from each of different color sheets and a filler sheet. The stack thickness may be further reduced to ensure matching a target pixel pitch which equals the total thickness contributed from each of different color subpixels (e.g., RGB subpixels in a RGB color system, other color subpixels in a non-RGB color system, etc.). Optical measurements for quality control may be made in Step 2 of FIG. 14 to ensure the stack thickness and sheet thicknesses match the pixel pitch and subpixel pitches.

In Step 3 of FIG. 14, the stack is sliced into strips of uniform widths. The strip width determines the final thickness of the color array panel. The cutting can be accomplished by mechanical means involving physical contact with the material or by laser cutting.

In Step 4 of FIG. 14, the strips are rotated by 90° axially and then the rotated strips are stacked to form the (final) color array panel. The process may be applied on continuous rolls of the raw materials.

In display operations, the blue light from the backlight of an LCD or from a blue OLED is either converted to red light by the red strip or green light by the green strip, and/or diffused through the filler strip. The thickness of the color array panel can be used as a design parameter to control a preconfigured white point of the display panel comprising the color array panel. The panel thickness affects the optical path lengths and likelihood with which incident blue light may be converted to the red and green light. Thus, the strip width in Step 3 of the example construction process of the color array panel in FIG. 14 can be used to control the display panel to realize the desired white point.

Color array panels can be manufactured to adapt to different pixel pitches since for a given display size there are usually a range of display resolution available. It should also be noted that for a LCD and an OLED of the same pixel pitch, a color array panel can be selected and applied to either display without extra customization.

9. Light Source Control Logic

Figure 15:
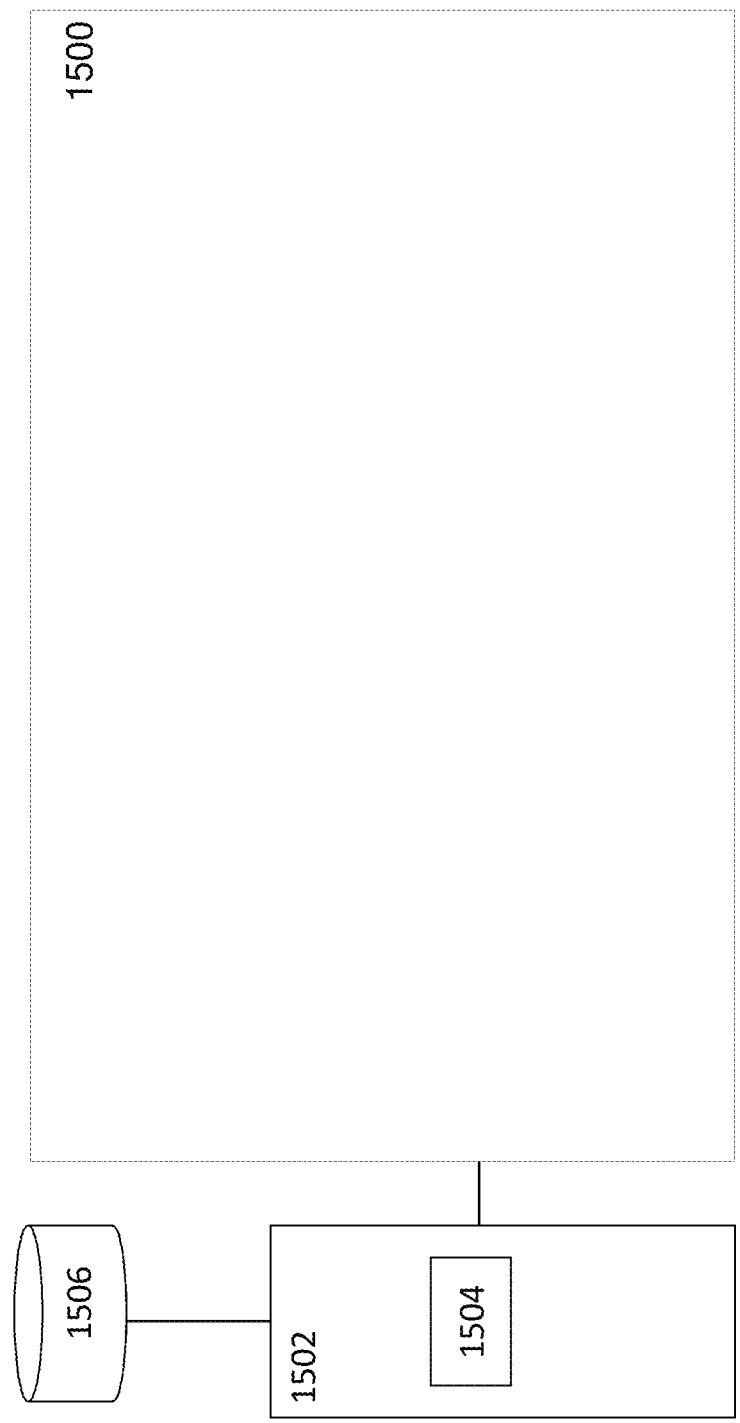
FIG. 15 illustrates an example configuration of display logic in a display system.

FIG. 15 illustrates an example configuration of display logic (1502) in a display system as described herein, in accordance with some possible embodiments of the present invention. In some possible embodiments, display logic 1502 additionally and/or optionally may comprise light source control logic (1504) configured to control component(s) in a light source (e.g., BLU 110) in the display system. The display logic 1502 may be operatively coupled with an image data source 1506 (e.g., a set-top box, networked server, storage media or the like) and is configured to receive image data from the image data source 1506. The image data may be provided by the image data source 1506 in a variety of ways including from an over-the-air broadcast, or Ethernet, High-Definition Multimedia Interface (HDMI), wireless network interface, devices (e.g., set-top box, server, storage medium, etc.), etc. Image frames received or generated from image data from an internal or external source may be used by the display logic 1502 to drive the light source in the display system. For example, display logic 1502 may be configured to control the light source to illuminate one or more pixels or sub-pixels with a specific intensity. The image frames may be used by the display logic 1502 to derive individual or aggregate pixel values in various frames in various resolutions on an image rendering surface as described herein.

10. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 16:
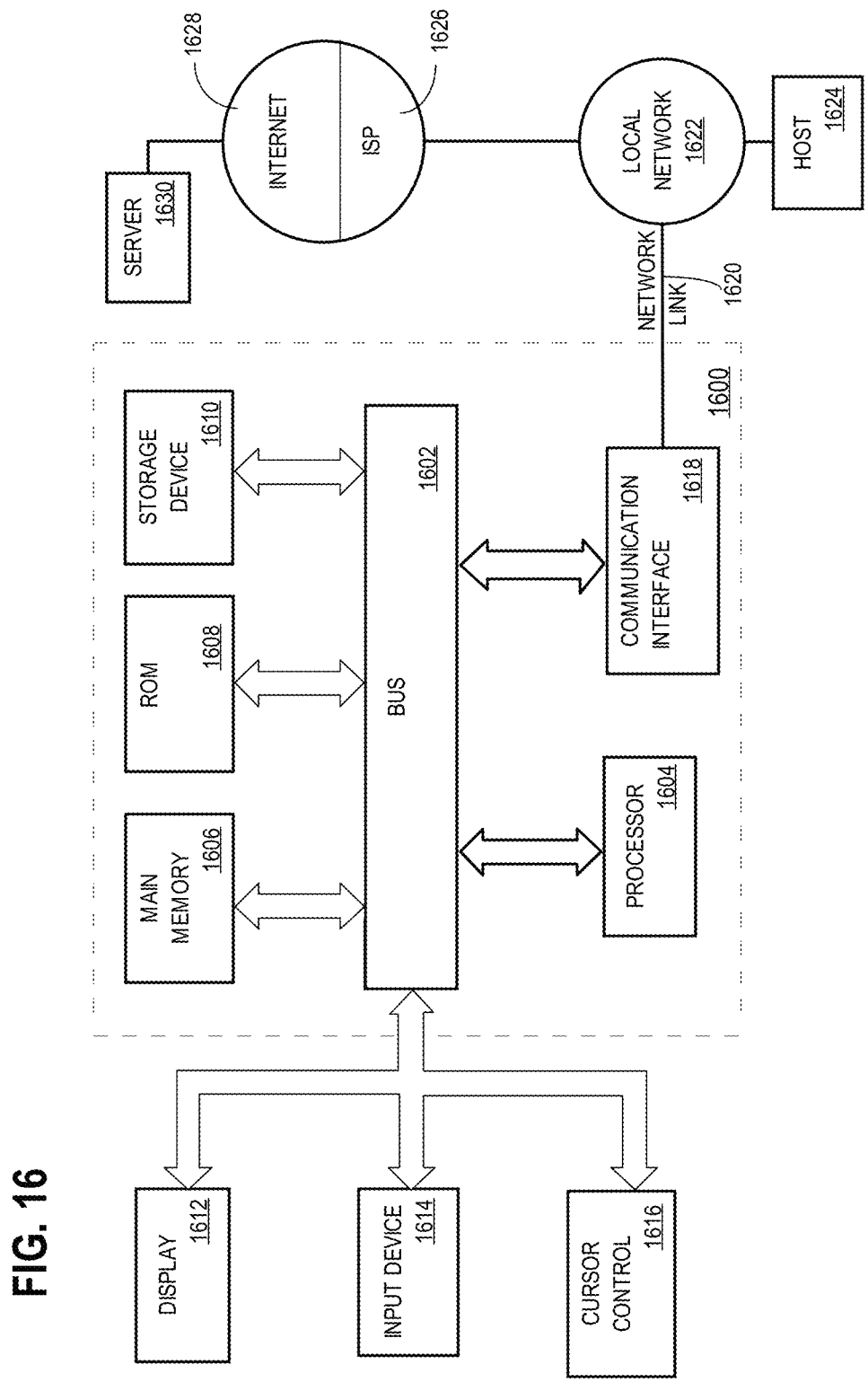
FIG. 16 illustrates an example hardware platform on which a computer or a computing device as described herein may be implemented.

For example, FIG. 16 is a block diagram that illustrates a computer system 1600 upon which an embodiment of the invention may be implemented. Computer system 1600 includes a bus 1602 or other communication mechanism for communicating information, and a hardware processor 1604 coupled with bus 1602 for processing information. Hardware processor 1604 may be, for example, a general purpose microprocessor.

Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Such instructions, when stored in non-transitory storage media accessible to processor 1604, render computer system 1600 into a special-purpose machine that is customized to perform the operations specified in the instructions.

Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a liquid crystal display, for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane.

Computer system 1600 may implement the techniques described herein using customized hard-wired logic, one or more ASICs or FPGAs, firmware and/or program logic which in combination with the computer system causes or programs computer system 1600 to be a special-purpose machine. According to one embodiment, the techniques as described herein are performed by computer system 1600 in response to processor 1604 executing one or more sequences of one or more instructions contained in main memory 1606. Such instructions may be read into main memory 1606 from another storage medium, such as storage device 1610. Execution of the sequences of instructions contained in main memory 1606 causes processor 1604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 1610. Volatile media includes dynamic memory, such as main memory 1606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1602. Transmission media can also take the form of acoustic or light waves, such as those generated during radio-wave and infra-red data communications.

Various forms of media may be involved in carrying one or more sequences of one or more instructions to processor 1604 for execution. For example, the instructions may initially be carried on a magnetic disk or solid state drive of a remote computer. The remote computer can load the instructions into its dynamic memory and send the instructions over a telephone line using a modem. A modem local to computer system 1600 can receive the data on the telephone line and use an infra-red transmitter to convert the data to an infra-red signal. An infra-red detector can receive the data carried in the infra-red signal and appropriate circuitry can place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card, cable modem, satellite modem, or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the world wide packet data communication network now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are example forms of transmission media.

Computer system 1600 can send messages and receive data, including program code, through the network(s), network link 1620 and communication interface 1618. In the Internet example, a server 1630 might transmit a requested code for an application program through Internet 1628, ISP 1626, local network 1622 and communication interface 1618.

The received code may be executed by processor 1604 as it is received, and/or stored in storage device 1610, or other non-volatile storage for later execution.

11. Equivalents, Extensions, Alternatives and Miscellaneous

In the foregoing specification, possible embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method, comprising:
   using a light modulation layer to modulate transmissive light;
   wherein a color filter layer comprises a plurality of pixel structures in a plurality of pixels,
      wherein each pixel in the plurality of pixels comprises one or more subpixels in a plurality of subpixels,
      wherein each pixel structure in the plurality of pixel structures comprising one or more subpixel structures in the plurality of subpixels;
   using each subpixel structure in the one or more subpixel structures of each such pixel structure to pass a corresponding primary color in a plurality of primary colors and to reflect other primary colors, other than the corresponding primary color, in the plurality of primary colors; and
   stimulating a light regeneration layer, disposed in between the light modulation layer and the color filter layer, by specific spectral components of light that transmits through the light regeneration layers and to convert at least a portion of the specific spectral components of light into second light, the second light comprising spectral components of one or more primary colors in the plurality of primary colors.

2. The method as recited in claim 1, wherein the light regeneration layer extends across the plurality of subpixels with homogeneous distribution of light regeneration materials over subpixels of different primary colors in the plurality of subpixels.

3. The method as recited in claim 1, wherein the light regeneration layer extends across the plurality of subpixels with non-homogeneous distribution of light regeneration materials configured to generate different primary colors in the one or more subpixels.

4. The method as recited in claim 1, wherein the color filter layer comprises a dichroic mirror that reflects the light of the one or more other primary colors.

5. The method as recited in claim 1, wherein the display system further comprises a second color filter layer disposed in between the light regeneration layer and the light modulation layer.

6. The method as recited in claim 5, wherein the second color filter layer comprises a homogeneous dichroic mirror configured to reject light of the one or more primary colors.

7. The method as recited in claim 5, wherein the second color filter layer comprises a non-homogeneous dichroic mirror.

8. The method as recited in claim 1, wherein the light regeneration layer comprises at least one of quantum dot materials, or phosphor materials.

9. The method as recited in claim 1, wherein each pixel in the plurality of pixels comprises a plurality of subpixel types that impart respective primary colors.

* * * * *

UNITED STATES PATENT AND TRADEMARK OFFICE
CERTIFICATE OF CORRECTION

| | | |
|---|---|---|
| PATENT NO. | : 11,454,847 B2 | Page 1 of 1 |
| APPLICATION NO. | : 16/568201 | |
| DATED | : September 27, 2022 | |
| INVENTOR(S) | : Ajit Ninan et al. | |

It is certified that error appears in the above-identified patent and that said Letters Patent is hereby corrected as shown below:

On the Title Page

Page 3, Column 2, item (56) OTHER PUBLICATIONS, Line 3, delete "Quantun" and insert --Quantum--.

Signed and Sealed this
Eleventh Day of February, 2025

Coke Morgan Stewart
*Acting Director of the United States Patent and Trademark Office*